324-77 SR

8/25/87 XR 4,688,464

United States Patent [19]

Gibson et al.

[11] Patent Number: 4,688,464

[45] Date of Patent: Aug. 25, 1987

[54] PITCH DETECTION APPARATUS

[75] Inventors: Brian C. Gibson, Victoria; George J. Spark, Martensville, both of Canada

[73] Assignee: IVL Technologies Ltd., Victoria, Canada

[21] Appl. No.: 820,756

[22] Filed: Jan. 16, 1986

[51] Int. Cl.[4] ........................ G10G 7/02; G01R 23/10

[52] U.S. Cl. ........................ 84/454; 364/484; 324/77 R; 324/78 R

[58] Field of Search ................. 84/454, 470 R, 477 R, 84/DIG. 18; 324/77 R, 77 A, 78 R, 78 D, 78 F, 78 Q, 78 Z; 364/484; 381/38, 49

[56] References Cited

U.S. PATENT DOCUMENTS

| | | | |
|---|---|---|---|
| 3,722,352 | 3/1973 | Ihrke et al. | 84/454 |
| 3,878,754 | 4/1975 | Barnum | 84/454 |
| 3,896,697 | 7/1975 | Iannone | 84/454 |
| 3,901,120 | 8/1975 | Youngquist | 84/454 |
| 3,919,913 | 11/1975 | Shrader | 84/454 |
| 4,019,419 | 4/1977 | Yoshikawa et al. | 84/454 |
| 4,028,985 | 6/1977 | Merritt | 84/454 |
| 4,163,408 | 8/1979 | Capano et al. | 84/454 |
| 4,217,808 | 8/1980 | Slepian et al. | 84/454 |
| 4,271,746 | 6/1981 | Dobbie | 84/454 |
| 4,273,023 | 6/1981 | Mercer | 84/454 |
| 4,281,577 | 4/1981 | Middleton | 84/454 |
| 4,321,853 | 3/1982 | Tumblin | 84/454 |
| 4,324,166 | 4/1982 | Foerst | 84/454 |
| 4,331,060 | 4/1982 | Allen | 84/454 |
| 4,351,216 | 9/1982 | Hamm | 84/454 X |
| 4,354,418 | 10/1982 | Moravec et al. | 84/454 |
| 4,369,687 | 1/1983 | Meyers | 84/454 |
| 4,377,961 | 3/1983 | Bode | 84/454 X |
| 4,399,732 | 8/1983 | Rothschild et al. | 84/454 X |
| 4,429,609 | 2/1984 | Warrender | 84/454 |
| 4,457,203 | 7/1984 | Schoenberg et al. | 84/454 |
| 4,523,506 | 6/1985 | Hollimon | 84/454 |

*Primary Examiner*—W. B. Perkey
*Attorney, Agent, or Firm*—Christensen, O'Connor, Johnson & Kindness

[57] ABSTRACT

A pitch detector is disclosed that automatically recognizes the pitch of musical notes quickly and outputs the pitch information in a variety of formats. The detector employs a microprocessor that samples the signal from a musical instrument or voice at regular intervals using an analog-to-digital converter and then utilizes both amplitude and time information from the waveform to determine the fundamental period of the note, while rejecting the harmonic components. The microprocessor analyzes the waveform looking for peaks that are approximately equal in amplitude separated by opposite polarity peaks. The time intervals between the peaks must be approximately equal too. Timing information is measured using more than one point on the waveform to avoid inaccuracies caused by temporary distortions of the waveform. The timing points are chosen at points where the slope of the waveform is high for substantially optimal accuracy. To filter out erroneous readings caused by pitch detection during note transition or noise, additional processing of the data is performed to cause a second corroborating reading to be taken when a note transition that is uncommon musically is detected.

21 Claims, 13 Drawing Figures

PITCH DETECTION APPARATUS

FIELD OF THE INVENTION

This invention relates to apparatus for determining the pitch of a musical note produced by voice or instrument and, more particularly, to such apparatus which analyze characteristics of a signal representative of the note to determine the pitch there.

BACKGROUND OF THE INVENTION

When a note is played or sung by a musician, a sound pressure waveform is established in the air around the musician. The waveform is periodic in time and can ideally be represented by a number of superimposed, interrelated sine waves. One of these waves has a "fundamental" frequency that is perceived as the pitch of the sound. A number of sine waves having frequencies that are integer multiples of the fundamental frequency are also included in the waveform. These additional sine waves are commonly referred to as "harmonics" or "overtones". Even with harmonics present, the pitch of the note is perceived to be the fundamental frequency of the waveform and, therefore, it is this frequency that is of interest.

When two or more musicians perform together, the production of aurally pleasing music is dependent upon the ability of each to produce a range of notes having fundamental frequencies that are substantially the same as those produced by the other musician. Thus, prior to an instrumental performance, it is necessary to tune the instrument, making the minor adjustments necessary to obtain the desired pitch for a particular note played. A device capable of outputting the error in pitch of the note produced can greatly aid the musician in this process.

Given the importance of proper pitch to the performance of music, it is also desirable for a singer or instrumental musician to develop a natural recognition of proper intonation. In this respect, a means for providing immediate feedback regarding intonation has been deemed helpful. For example, it would be quite helpful to a student to be able to continuously monitor intonation problems throughout his or her performance. This monitoring can be performed by the student directly or with the help of computer software when the pitch information is supplied to a computer. Additionally, with immediate intonation feedback available, the information can be input to a synthesizer, which produces an output in response thereto. In this arrangement, the source of the musical note analyzed effectively serves as a keyboard for the synthesizer.

The production of immediate pitch feedback, however, is subject to a number of difficulties. The fundamental frequency of the note played is the inverse of the period of the fundamental sinusoidal component. Thus, if this period can be determined from the waveform, the pitch is readily available. To determine the period, the timing associated with a current point on the waveform must be precisely identified, the period being the time elapsed between repetitions of this reference point. The selection of a suitable reference point, however, is frequently made difficult by the complexity of the waveform involved. As noted earlier, harmonics may be present, producing a number of peaks of varying amplitude for each cycle of the waveform. In addition, the waveform may be subject to periodic amplitude and frequency fluctuations. Even with a suitable reference point selected, the irregularities in the waveform noted may make it difficult to determine the precise time interval elapsed between occurrences of the reference point. The problem of accurate timing is further exaccerbated by the need to produce a determination of pitch over a relatively few cycles of the waveform if the feedback is to be substantially immediate. While a number of devices have been developed in the past to determine the pitch of a note, none has proved fully capable of overcoming these difficulties.

A commonly used reference point for determining the period of the waveform is the zero crossing of the signal. Zero crossings are used, for example, in the electronic tuning aid disclosed by Hollimon (U.S. Pat. No. 4,523,506). For a simple sine wave, the period is easily determined as the time interval between alternate zero crossings of the signal. In addition, because the region of the sine wave having zero amplitude exhibits a relatively high slope, the timing of such zero crossings can be accurately determined. More complex signals, however, can render the zero crossing an unsuitable reference for period detection. For example, the inclusion of harmonics may produce a multitude of zero crossings per cycle, requiring some means for determining which zero crossing indicates the end of the cycle. In addition, waveform complexity may produce a zero crossing region having a relatively low slope, thereby making it difficult to precisely determine the time of the zero crossing and, hence, the period of the signal.

Another common method of determining the period of the fundamental frequency is by using a peak detector circuit responsive to the time interval between peaks of the signal. Peak detection is used, for example, in the apparatus disclosed by Mercer (U.S. Pat. No. 4,273,023). As with zero crossing techniques, peak detection works well with a simple signal, such as a sine wave. When more complex signals are involved, however, the accuracy of peak detection also suffers. For example, the inclusion of harmonics in the signal may produce a number of peaks having similar amplitudes, making it difficult to determine which peak is the reference peak used in measuring the period of the signal. The presence of periodic amplitude fluctuations may similarly affect the accuracy of the method. In addition, the reference peak selected for the signal may also exhibit a relatively low slope, making a precise determination of the timing of the peak difficult to obtain. Thus, an accurate determination of the period is not available.

To overcome some of the problems encountered by zero crossing and peak detection techniques, methods have been developed using the portion of the signal that crosses a set threshold as the reference point for determining the period. For example, in the method and apparatus disclosed by Slepian et al. (U.S. Pat. No. 4,217,808), an automatic gain control device adjusts the positive and negative excursions of the signal to selected levels. Positive and negative thresholds are then established, equal to a percentage of these maximum excursion levels. The period is essentially defined as the time between a first upward crossing of the positive threshold by the signal and a second upward crossing of the positive threshold, separated in time by a downward crossing of the negative threshold. This method of period determination, however, is not without its problems. Like the zero crossing and peak detection techniques, the establishment of a threshold at a predetermined percentage of the maximum peak excursions includes no provision for ensuring that the reference point will correspond to high-slope regions of the signal. Thus, the signal may be relatively low in slope at the threshold crossing, making the exact time of occurrence difficult to ascertain.

Because the timing of the reference points used to determine the period of the signal may be difficult to precisely determine, another technique employs the computation of an average period from a plurality of period measurements as a way of improving accuracy. For example, the note analyzer disclosed by Moravec et al. (U.S. Pat. No. 4,354,418), establishes separate period data counts for a number of cycles of the signal and outputs a period that is an average of the period data counts produced. This system has the disadvantage of making the accuracy of the period determination a function of the number of cycles of the signal analyzed. For apparatus used to provide immediate feedback to musicians, such a technique may be unacceptable.

Prior art techniques have also suggested the establishment of a trial period for comparison with subsequent period measurements. In the note analyzer disclosed by Moravec et al. a target signal is produced that indicates the expected value of the period and rejects subsequent period measurements falling outside a predetermined range of the target signal. When a predetermined number of acceptable period measurements are obtained, the target signal is updated. While this technique has the advantage of further increasing the accuracy and reliability of the period measurement, it does so at the expense of increased measurement time, making immediate feedback to a musician concerning a note played or sung difficult, if not impossible.

For a period determination to be made readily understandable to a musician, reference to the nomenclature of musical notes is typically relied upon. For example, in the apparatus disclosed by Slepian et al., the output is compared with data stored in a look-up table to determine the semitone that the note played is closest to. The note played can then be displayed for the musician.

From the foregoing discussion, it can be appreciated that a pitch detection apparatus capable of producing highly accurate pitch determinations over relatively few cycles of the signal would be most desirable. Heretofore, means relied upon have been unable to produce timing information based upon high-slope regions of the signal whose time can be precisely determined. Thus, the accuracy of individual period determination suffered. Attempts to correct for these inaccuracies by averaging a number of period determinations have required a relatively long measurement time. Thus, the prior art apparently exhibits a tradeoff between accuracy of a given period determination and spontaneity of results.

SUMMARY OF THE INVENTION

A pitch detection apparatus is disclosed, for determining the pitch of a substantially periodic audio input signal having one or more sinusoidal components forming a series of peaks of a given polarity that are separated by at least one peak of opposite polarity and which define at least one cycle of the input signal, comprising:

a first means for producing a plurality of distinct sample timing intervals from substantially the same portion of the input signal;

a second means for producing an indication of the period of the input signal from the plurality of distinct sample timing intervals; and a third means for converting the indication of the period of the input signal into a determination of the pitch of the input signal.

The indication of the period is, in turn, produced by means for determining an average sample timing interval from selected ones of the sample timing intervals and means for dividing the average sample timing interval by the number of cycles of the portion of the input signal the sample timing intervals were produced from.

The sample timing intervals are produced in response to means for identifying a substantially recurrent reference peak on the input signal, the reference peak separated in occurrence by a peak of opposite polarity and having an amplitude at least a predetermined percentage of the maximum peak amplitude of the input signal.

The peak detection apparatus further comprises means for establishing a plurality of timing thresholds, at least some of the thresholds being established at an amplitude at which the input signal exhibits a relatively high slope. The means for producing the sample timing intervals initiates the intervals, as the edge of the input signal leading to the reference peak crosses predetermined ones of the thresholds, and as the last edge of the same cycle of the input signal trailing to the next occurrence of the reference peak crosses predetermined ones of the thresholds. The means for producing the sample timing intervals then terminates the intervals as corresponding edges of a subsequent cycle of the input signal cross corresponding ones of the thresholds.

To assist in identifying the recurrent reference peak, a means for establishing positive and negative peak detection thresholds and for adjusting these thresholds in response to variations of the input signal is employed. The positive threshold is adjusted when a positive peak is received that is larger than the previous positive threshold, and the negative threshold is adjusted when a negative peak is received that is larger than the previous negative threshold. These thresholds are used to determine whether a particular peak analyzed is of substantially the same amplitude as the reference peak selected.

The means for identifying the recurrent reference peak further comprises:

means for establishing an adjustable trial period for the input signal from a first portion of the signal;

means for establishing a test period for the signal from a second portion of the signal; and means for comparing the test period to the trial period. When the test period is a predetermined amount less than the trial period, no subsequent occurrence of the reference peak has been encountered and the apparatus continues to search for such an occurrence of the reference peak. When the test period exceeds the trial period by a predetermined amount, the initial occurrence of the reference peak is reestablished.

The means for converting the indication of the input signal period into an indication of pitch may further comprise means for comparing the input signal pitch to the pitches of the various musical notes and producing an indication of which note the input signal is closest to in pitch and the difference in pitch between the input signal and the note.

BRIEF DESCRIPTION OF THE DRAWINGS

The invention can be understood by reference to the following portion of the specification, taken in conjunction with the accompanying drawings in which:

FIGS. 4A through 4D are flow charts illustrating the program steps undertaken by the microprocessor of the pitch detector in the ANALYZE WAVEFORM routine;

DETAILED DESCRIPTION OF THE INVENTION

Figure 1:
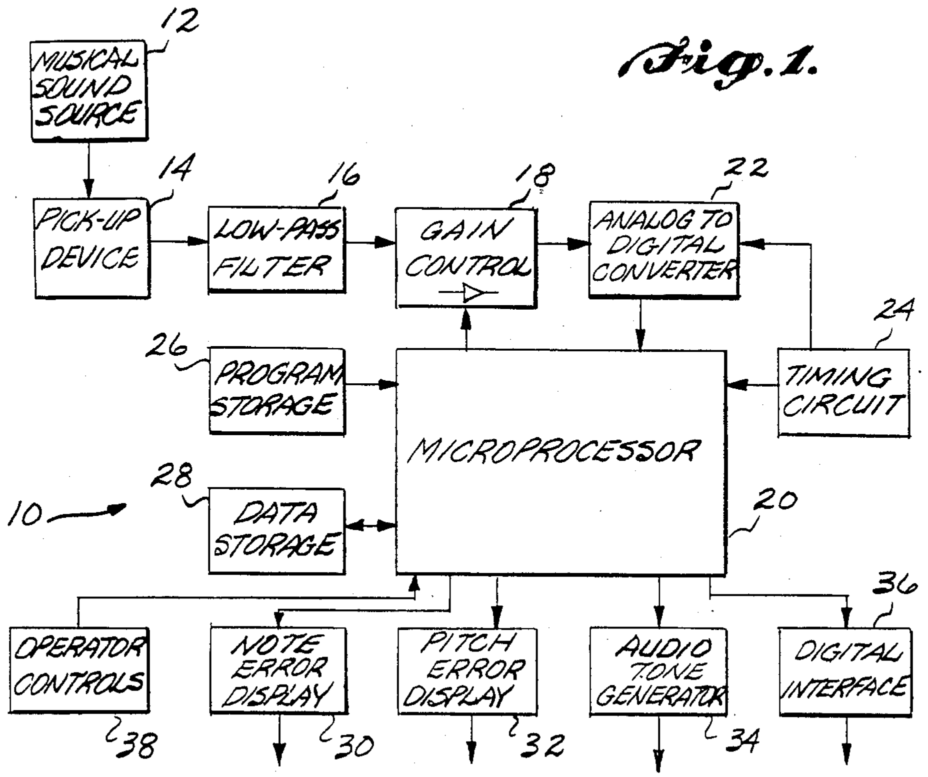
FIG. 1 is an electrical block diagram of the pitch detector including a microprocessor.

Referring now to FIG. 1, the pitch detector 10 produces an output indicative of the pitch of a note produced by musical sound source 12. Pickup device 14 produces an electrical analog input signal representative of the musical note received from sound source 12. For example, a microphone may be used, converting the sound pressure waveform developed in the air by source 12 into an input signal having amplitude variations corresponding in time to compressions and rarefactions exhibited by the sound pressure waveform. Similarly, when sound source 12 is a musical instrument, a pickup 14 responsive to the motion of a component of the instrument, for example, a guitar string or saxophone reed, may be used, producing an input signal having amplitude variations corresponding in time to the vibration amplitude of the sensed component of the instrument.

The analog input signal produced by pickup 14 is input to low-pass filter 16. Low-pass filter 16 serves several functions. First, by removing the high-frequency harmonics associated with the fundamental frequency of the input signal, the signal required to be analyzed by pitch detector 10 is somewhat simplified. Thus, quick, accurate measurements of the signal period can be made with less complex circuitry. Second, the low-pass filter 16 removal of high-frequency components from the signal also minimizes the effect of a form of distortion known as "aliasing" on the period determination. Because the analog input signal is ultimately to be converted to a digital signal, sampling theory indicates that the digital sampling rate must be at least twice that of the highest frequency component of the analog signal if it is to be faithfully reconstructed. Without the low-pass filter, it would be difficult to select a given sampling rate with any confidence that the sampling rate chosen was more than twice the highest frequency component of the variant analog input signals produced by pickup 14. With low-pass filter 16 in the circuit, signals exceeding a selected frequency can be severely attenuated. By using a sampling rate that is twice the selected frequency, aliasing distortion is rendered insignificant. In the preferred embodiment, an 80-microsecond clock frequency and corresponding 12.5 kHz sampling rate have been found acceptable. Thus, to minimize the effect of aliasing distortion, high-frequency components exceeding 6.25 kHz must be attenuated by the low-pass filter 16. A three-pole low-pass filter 16 producing approximately 40 dB of attenuation for such signals has been found suitable.

The analog input signal next passes through a gain control amplifier 18. The gain of amplifier 18 is controllable by microprocessor 20 in eight steps. These steps range from a gain of two to a gain of 256, with each step differing in gain by a factor of two. Each time microprocessor 20 initiates an analysis of the input signal, the gain of amplifier 18 is set to its maximum value. If the gain selected produces a signal that approaches the limits of subsequent circuitry, the gain is dropped in steps until the maximum signal level produced falls within a predetermined percentage of the subsequent circuitry's limits. As will be shown in greater detail below, the gain selected by microprocessor 20 is also interpreted in the subsequent period analysis of the input signal to correspondingly adjust information about the waveform.

The analog signal output by amplifier 18 is input to analog-to-digital (A/D) converter 22, which provides an eight-bit digital representation of the signal. Thus, values ranging from zero to 255 are produced; with 128 corresponding to a zero signal level, 255 corresponding to the maximum positive signal level, and zero corresponding to the maximum negative signal level. In the preferred embodiment, the data conversion time is 32 microseconds. Any gain control adjustments made by microprocessor 20 with respect to amplifier 18 must occur before the next A/D conversion takes place, if a useful signal level is to be obtained. In that respect, a gain control taking only 20 microseconds to settle to a new value has been found acceptable.

A timing circuit 24 provides periodic signals to A/D converter 22, initiating the A/D conversions and interrupting microprocessor 20 when each conversion is complete. As noted previously, a clock frequency of 80 microseconds has been found suitable. For accuracy and stability, the timing signals produced by timing circuit 24 are referenced to a crystal clock in microprocessor 20.

The program used by microprocessor 20 to analyze the digital waveform produced by A/D converter 22 is stored in program storage 26. Similarly, information about the input signal used by microprocessor 20 in the analysis is stored in data storage 28.

Note and pitch error displays 30 and 32, respectively, provide useful information to the musician about the intonation of the sound received from musical sound source 12. In the preferred embodiment, note display 30 consists of a dot matrix of light-emitting diode (LEDs) that indicate the name of the note closest in pitch to that of the input signal. In addition, two separate LED indicators produce either a sharp or flat sign. The deviation in pitch of the input signal from the note displayed is provided by pitch error display 32. The pitch error display 32, in the preferred embodiment, consists of a 49-element LED bar graph that is illuminated at the center when the input signal corresponds exactly to the display of note display 30. When the note is sharp or flat, LEDs on either side may be lit, each LED being used to represent a pitch error of two cents, or 2/100 of a semitone.

In some applications of pitch detector 10, for example, intonation development, an audio output of the proper note is useful. Thus, audio tone generator 34 is employed. Because of its ease of generation, a square wave corresponding to the desired note frequency is produced by audio tone generator 34. The output of generator 34, however, should be pleasing. In addition, the output signal should include some harmonics, making comparison and tuning of the note produced by sound source 12 to that produced by audio tone generator 34 easier. In light of these considerations, a low-pass filter is used to shape the square wave into a triangle wave having sufficient harmonic content to make tuning easy without sounding overly harsh. A gain control amplifier minimizes amplitude fluctuations in the triangle wave further easing tuning operations.

A digital interface 36 is provided that can be used to connect pitch detector 10 to other apparatus. For example, the note information produced by microprocessor 20 may be sent to a synthesizer, in which case sound source 12 acts effectively as the keyboard for the synthesizer, or a computer, for use in software-aided intonation training. A common, standardized format for transmitting musical information at the interface is the Musical Instrument Digital Interface (MIDI). Used in the format, a serial interface operating at a rate of 31.25 kbps and employing a current loop signalling technique has been found acceptable.

External control of pitch detector 10 is enabled by operator controls 38. Among other things, the musician can adjust the audio tone volume by causing microprocessing 20 to adjust the signal level of the output of tone generator 34. Similarly, the reference note produced by audio tone generator 34 can be selected as desired for tuning. Additionally, parameters of the MIDI digital interface can be selected as desired.

Figure 2A:
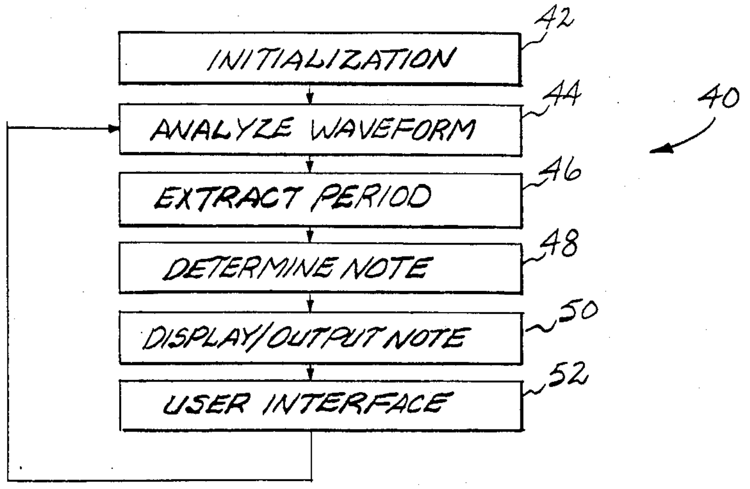
FIGS. 2A and 2B are, respectively, a flow chart of the program steps undertaken by the microprocessor of the pitch detector apparatus during a MAIN program and an illustrative input signal analyzed thereby.

FIG. 2A illustrates a flow chart of the MAIN program 40 located in program storage 26. Briefly, the INITIALIZATION routine 42 establishes initial values for parameters that will subsequently be determined, used, and adjusted by the ANALYZE WAVEFORM routine 44. The ANALYZE WAVEFORM routine 44, in turn, analyzes the digital signal input to microprocessor 20, selecting a substantially optimal reference peak for measuring the period of the signal and producing timing information corresponding to high-slope regions of the signal associated with that reference peak. An average determination of the period is produced by the EXTRACT PERIOD routine 46 from that timing information derived by the ANALYZE WAVEFORM routine 44 that is believed to be most accurate. Because a digital reconstruction of the analog waveform produced by pickup 14 is used, the EXTRACT PERIOD routine 46 also includes a method of interpolating the time occurrence of points located between digital increments. The DETERMINE NOTE routine 48 utilizes the period information derived by the EXTRACT PERIOD routine 46 to determine the musical note closest in pitch to that produced by musical sound source 12. An indication of the error in pitch between the waveform produced by sound source 12 and the note determined is also produced. Finally, to improve the accuracy of the routine, unusual note changes are reevaluated before an output is produced. The note and pitch error information produced by the DETERMINE NOTE routine 48 is input to the DISPLAY/OUTPUT NOTE routine 50. This routine is capable of producing a variety of responses useful to the musician, such as a display of the note produced by musical sound source 12 or a referential audio tone for tuning. The USER INTERFACE routine 52 allows the operator to adjust a variety of pitch detector 10 control parameters, such as audio tone signal level, prior to reinitiating the ANALYZE WAVEFORM routine 44.

Figure 2B:
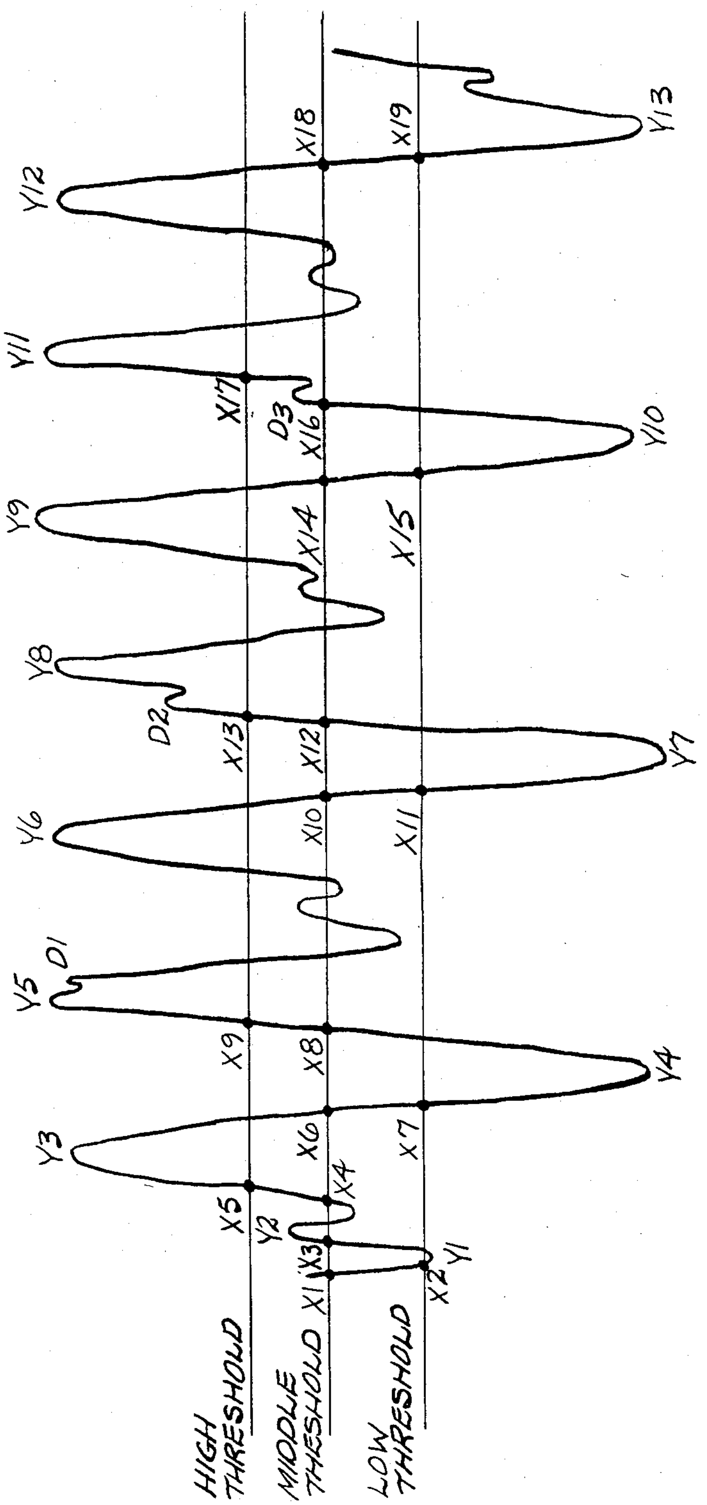

The general operation of the MAIN program 40 may be better understood with reference to FIG. 2B, which illustrates a portion of a representative analog signal S received by A/D converter 22. The INITIALIZATION routine 42 initializes values, for positive and negative peak detection thresholds at, for example, zero. The peak detection thresholds are used in comparing subsequent peaks of signal S with the reference peak selected. The INITIALIZATION routine 42 also establishes low, middle, and high timing thresholds at levels empirically determined to correspond to regions of the signal S having relative high slopes. The timing thresholds are used to provide highly accurate timing information about the signal S at points preceding and following the occurrence of the reference peak. In FIG. 2B, the middle threshold is shown set at zero, while the low and high thresholds are established at levels corresponding to negative and positive regions of the signal, respectively.

The ANALYZE WAVEFORM routine 44 receives continuously updated information about the signal S and, initially, awaits the occurrence of a peak of either polarity. As shown in FIG. 2B, the negative peak Y1 is encountered first and is initially identified as the reference peak used in determining the period of the signal. The negative peak detection threshold is then set at a predetermined percentage of the level of peak Y1. Subsequent negative peaks are compared to the negative peak detection threshold and those peaks having an absolute value falling within a predetermined range above the threshold are considered as possible "recurrences" of the reference peak, or peaks spaced from the reference peak by an integer multiple of periods. Timing information related to the occurrence of a negative peak is derived from the signal S crossings of the middle and low timing thresholds. Thus, the crossings X1 and X2 are used to referentially identify the occurrence of Y1 and form a first set of initial cycle timing points used to mark the beginning of the period measured. Because the timing thresholds correspond to high slope regions of the signal S, timing information derived from these crossings can be precisely determined.

With a negative peak encountered, the ANALYZE WAVEFORM routine 44 next awaits the occurrence of a positive signal peak and the positive peak Y2 is encountered. By requiring that a peak of opposite polarity follow the reference peak before a period determination is made, the program eliminates the possibility of an erroneous period determination based upon the consecutive occurrence of peaks having relatively the same amplitude and polarity. Such peaks may, for example, be introduced by harmonics and might otherwise be identified as the recurrence of a periodic reference peak. Timing information related to the occurrence of a positive peak is derived from the signal S crossings of the middle and high timing thresholds. Thus, threshold crossing information X3 preceding the occurrence of peak Y2 is saved. Because the high timing threshold was not crossed, X3 forms an incomplete second set of initial cycle timing points. Before continuing, the positive peak detection threshold level is established at a predetermined percentage of peak Y2.

The ANALYZE WAVEFORM routine 44 next searches for a peak exceeding the previously established negative peak detection threshold. The negative peak immediately following peak Y2 clearly does not satisfy this requirement. In addition, before such a peak is found, peak Y3 is encountered. Because the amplitude of peak Y3 is much greater than that of peak Y1, the same amount of signal distortion has a greater relative effect on the magnitude of peak Y1 than it does on peak Y3. Therefore, the recurrence of peak Y3 can more confidently be identified. For this reason, the ANALYZE WAVEFORM routine 44 establishes peak Y3 as the new reference peak for use in period measurements. The middle and high timing threshold crossings, X4 and X5, immediately preceding peak Y3, replace X1 and X2 as the first set of initial cycle timing points to be used in subsequent period computations. The positive peak detection threshold is, at this time, reset to the predetermined percentage of peak Y3.

With the new reference peak Y3 established, the ANALYZE WAVEFORM routine 44 next searches for a negative peak exceeding the negative peak detection threshold. Peak Y4 is encountered, satisfying this requirement, and the middle and low timing threshold crossings X6 and X7 are stored as the second set of initial cycle timing points used to mark the beginning of the period measured.

Next, a positive peak exceeding the positive peak detection threshold is sought and an acceptable peak Y5 encountered. The middle and high timing threshold crossings X8 and X9 preceding peak Y5 are stored as information about the most recent edge of the signal. Because an acceptable positive peak has been found, these timing points precede a possible recurrence of the positive reference peak Y3 and are therefore compared to the corresponding crossings X4 and X5 preceding peak Y3. The intervals X9-X5 and X8-X4 are stored as trial periods to be used in comparing future signal period information.

The ANALYZE WAVEFORM routine 44 next searches for a negative peak exceeding the negative peak detection threshold. Before such a peak is encountered, the routine first encounters a pair of inflection points D1 produced by signal distortion. D1 is ignored by the routine because the first inflection point is neither a negative peak nor a positive peak and the second point, a positive peak, is not separated from peak Y5 by an acceptable negative peak. A negative peak, positive peak, and second negative peak are then encountered, in that order, and each ignored because it fails to exceed the relevant peak detection threshold. Next, a peak Y6 exceeding the positive peak detection threshold is reached. The peak is ignored because a peak exceeding the negative peak detection threshold has not occurred between it and the last acceptable positive peak Y5. Thus, an erroneous period determination based upon the distance between peaks Y5 and Y6 is avoided.

With an acceptable negative peak Y7 encountered, the middle and low timing threshold crossings X10 and X11 preceding the peak are stored as the recent edge information. In addition, the negative peak detection threshold is reestablished at the predetermined percentage of the level of peak Y7. At this time, the ANALYZE WAVEFORM routine 44 searches for another acceptable positive peak. The positive peak produced by signal distortion at D2 is not recognized because the positive peak detection threshold has not been exceeded. Peak Y8 is encountered next and it does exceed the positive peak detection threshold.

Test periods X13-X9 and X12-X8 are established and compared to the respective trial periods X9-X5 and X8-X4, previously established. If these test periods are each a predetermined amount less than the corresponding trial periods, for example, 12.5 percent, the routine continues to search for a recurrence of the reference peak. If the test periods exceed the corresponding trial periods by a predetermined amount, however, the current trial period is rejected. The variation in the intervals between peaks Y5 and Y8 and between peaks Y3 and Y5 indicates that the initial selection of Y3 as a reference peak was improper. Thus, Y5 will now be used as the reference peak. The middle and high timing threshold crossings X12 and X13 are saved and the positive peak detection threshold is adjusted. Because test periods X13-X9 and X12-X8 exceed trial periods X9-X5 and X8-X4 by the predetermined amount, the previous trial periods are rejected and reestablished at the value of the test periods.

The ANALYZE WAVEFORM routine 44 continues on in this manner, ignoring the positive peak Y9 and the lesser preceding peaks, recognizing negative peak Y10 and storing the preceding timing crossings X14 and X15, ignoring distortion D3, and recognizing positive peak Y11 and storing its preceding timing threshold crossings X16 and X17. At this time, new test periods X17-X13 and X16-X12 are compared to trial periods X13-X9 and X12-X8. At least one of these test periods is within the predetermined range of the corresponding trial period and, therefore, an acceptable reference peak Y5, followed by recurrent peaks Y8 and Y11, has been identified. The ANALYZE WAVEFORM routine 44 continues extracting timing information in the preceding manner, for example, ignoring peak Y12 and the lesser preceding peaks and recognizing peak Y13 and its preceding timing threshold crossings X18 and X19, until a maximum measurement time, for example, 10 milliseconds, is exceeded.

The EXTRACT PERIOD routine 46 determines the period from the timing information derived by the ANALYZE WAVEFORM routine 44. With reference to the signal S shown in FIG. 2B, if the maximum measurement time prevented the gathering of additional timing information after peak Y13, the period would be determined as follows. First and second sets of final cycle timing information are defined by X16 and X17, and X18 and X19, respectively. Four sample timing intervals equal to X17-X9, X16-X8, X18-X10, and X19-X11 are then established. These intervals are compared and the two most nearly the same in duration used to compute an average sample timing interval. That interval is divided by the number of cycles from which the information was derived, in this case, two, to provide a period estimate of the input signal. The period estimate is then used by the DETERMINE NOTE routine 48 and DISPLAY/OUTPUT NOTE routine 50 to indicate to the musician the musical note closest to that produced by sound source 12 and the relative error in pitch between the two.

Figure 3:
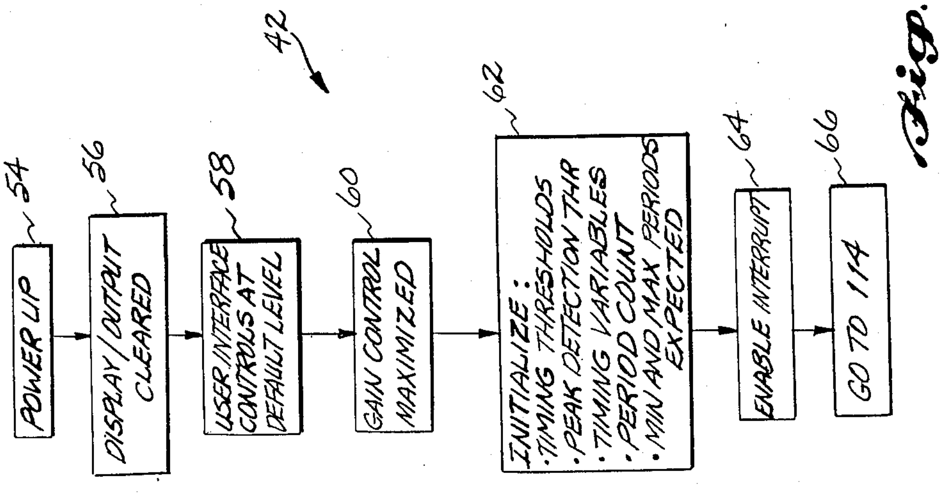
FIG. 3 is a flow chart illustrating the program steps undertaken by the microprocessor of the pitch detector in the INITIALIZATION routine.

The details of the routines illustrated in the MAIN program flow chart of FIG. 2 will now be considered in greater detail. First, the INITIALIZATION routine 42 shown in FIG. 3A will be considered. In step 54, the pitch detector 10 is powered up in response to a signal from operator controls 38. At this time, a number of steps are taken that can be performed in any order. In step 56, the outputs of note display 30, pitch error display 32, audio tone generator 34, and digital interface 36 are cleared. The parameters of pitch detector 10 controlled by operator controls 38, for example, the signal level of audio tone generator 34, are set to their default levels in step 58 of the INITIALIZATION routine 42. In step 60, the gain of amplifier 18 is set to its maximum value. In step 62, initial values for the timing thresholds, peak detection thresholds, edge timing variables, and period count used by the remainder of the program are placed in data storage 28. When these steps have been completed, step 64 enables the INTERRUPT HANDLER subroutine 68 of the ANALYZE WAVEFORM routine 44, and the INITIALIZATION routine 42 exits to the INTERRUPT HANDLER routine 68 at step 66.

The INTERRUPT HANDLER subroutine 68 begins the ANALYZE WAVEFORM routine 44 and is invoked recurrently throughout the routine every time a new sample is available from the A/D converter 22, as will be shown below. An interrupt rate of 80 microseconds has been found suitable to allow all processing of one sample to be completed before the next sample from A/D converter 22 becomes available. With an interrupt rate of 80 microseconds, and a preset, maximum allowable period measurement time of 10 milliseconds, worst-case accuracy of the pitch determination is 12 cents (one cent=1/100th of a semitone), which will adequately identify the note produced by musical sound source 12. Interpolation of the timing data and averaging a number of sample timing intervals, as explained below, further increase the accuracy of the pitch error determination to one cent.

Figure 4B:
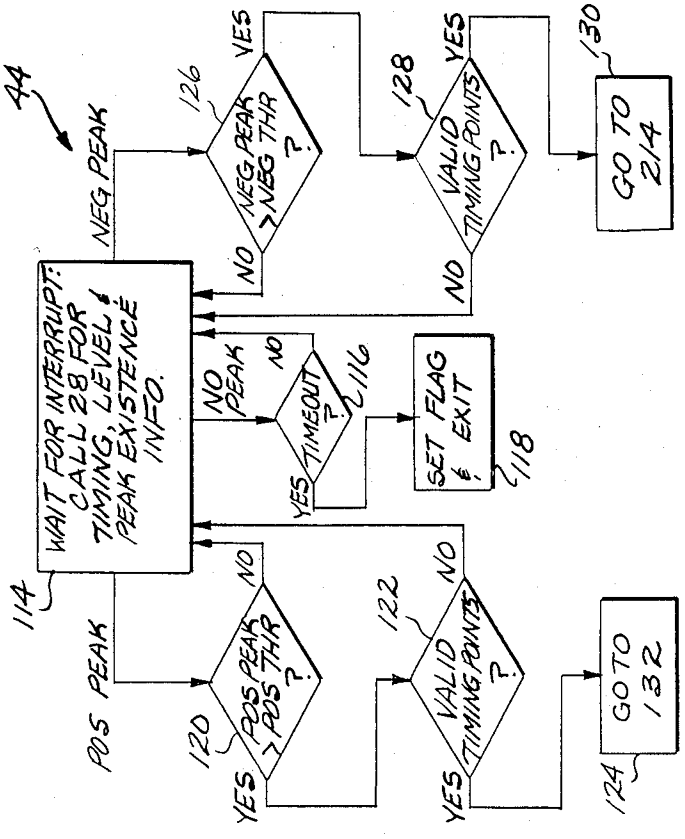
Figure 4A:
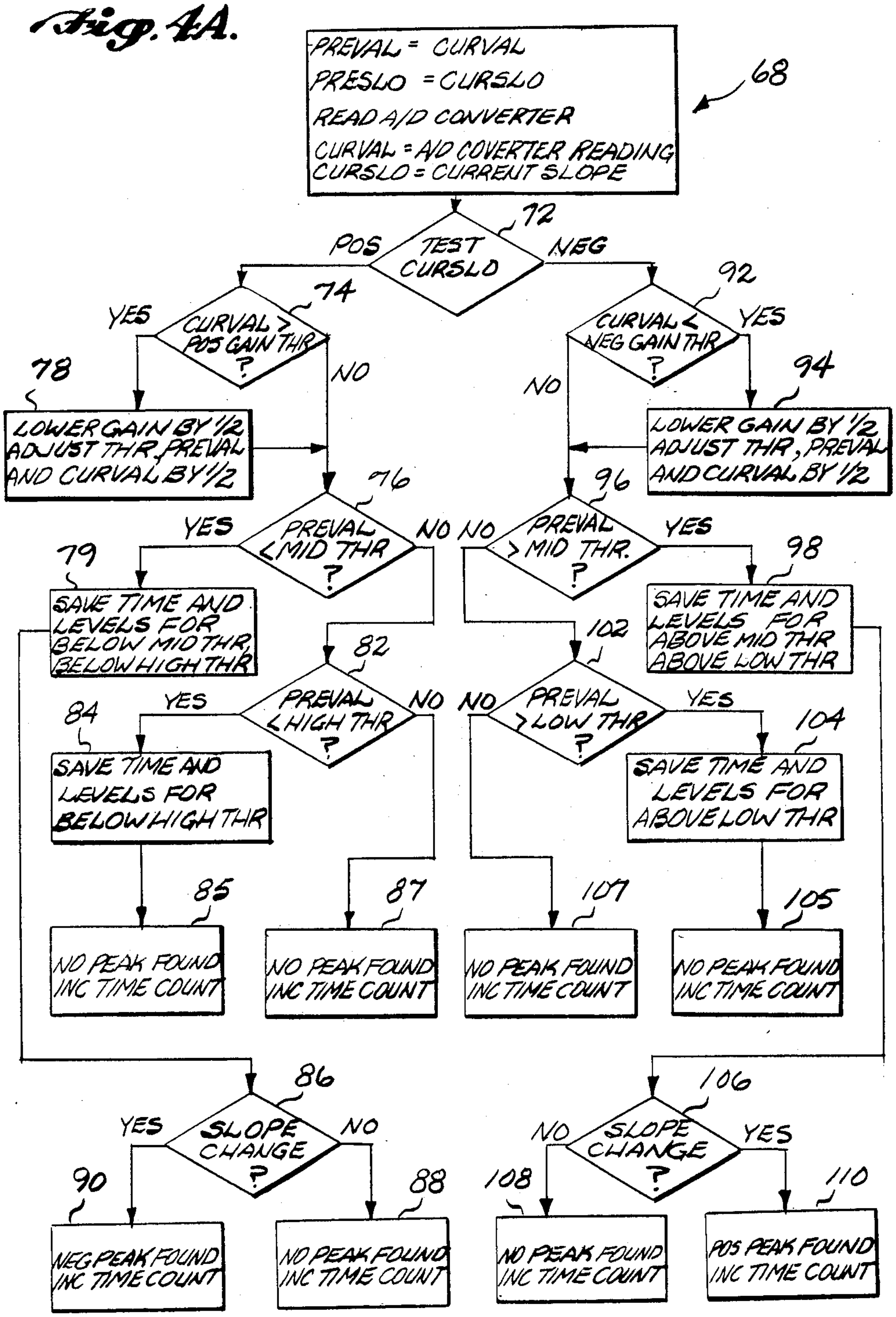

As shown in FIG. 4A, the INTERRUPT HANDLER subroutine 68 stores and operates upon the value of the signal level by the current A/D conversion (CurVal), the value of the signal level established at the previous A/D conversion (PrevVal), and the slope of the signal produced by A/D converter 22 at both the current (CurSlo) and previous (PrevSlo) A/D conversions. In step 70 the INTERRUPT HANDLER subroutine 68 is initialzed. The initialization step 70 performs four separate operations. First, the previous signal level variable PrevVal is set equal to CurVal, which is the value of the signal level produced by A/D converter 22 during the last invocation of the INTERRUPT HANDLER subroutine 68. Second, the direction of signal slope at the previous A/D conversion, now stored in variable CurSlo, is assigned to variable PrevSlo. Third, the signal produced by A/D converter 22 is read, making data from this conversion available to the subroutine. Finally, the current value of signal level and the sign of the signal slope are established in accordance with this most recent reading of the signal produced by A/D converter 22.

Operation of the INTERRUPT HANDLER subroutine 68 essentially begins at step 72. There, the direction of the current slope of the signal produced by A/D converter 22 is tested. If the slope is positive, the subroutine progresses to step 74. In step 74, the current value of the input signal is compared to a fixed, positive gain threshold. Because pitch detector 10 must be responsive to music produced by sound source 12 over a large dynamic range, varying with the loudness of the note played and the proximity of the sound source 12 to pickup 14, the gain of the input signal for a particular note produced is optimized by gain control amplifier 18 as previously described. To prevent the amplifier from saturating and producing a signal beyond the full-scale output range of A/D converter 22, the gain of amplifier 18 is adjusted downward when it exceeds a predetermined percentage of the full-scale A/D converter 22 output. The positive gain threshold is set at this predetermined percentage and is, therefore, not required to be initialized or adjusted by the program. As long as the current value of the input signal level does not exceed the positive gain threshold set, step 74 causes the program to flow directly to step 76. If the positive gain threshold has been exceeded, however, step 78 of the subroutine lowers the gain of amplifier 18 by one-half, adjusts peak detection thresholds used by subsequent portions of the ANALYZE WAVEFORM routine 44 downward a corresponding one-half, and reduces the stored values of current and previous input signal level by one-half. The gain adjustment is made rapidly enough that the next waveform sample produced by the INTERRUPT HANDLER subroutine 68 will be at the adjusted gain. The adjustment of the current and previous values of signal level allows future comparisons involving these levels to be readily made.

At this point, step 76 of the INTERRUPT HANDLER subroutine 68 compares the stored value of the previous signal level to a middle timing threshold level (MidThr) initialized in step 62 of the INITIALIZATION routine 42. This middle threshold is one of three timing thresholds used to produce referential time points on the input signal from which the period can be derived. As will be seen, positive slope crossings of the middle threshold and a high threshold (HighThr) are used in computing sample timing intervals from which the period will ultimately be determined, as are negative slope crossings of the middle threshold and a low threshold (LowThr). Each of the thresholds is initialized by step 62 of INITIALIZATION routine 42 and is set at a value empirically determined to correspond to a region of the input signal having a slope that is high in absolute value, thereby making timing measurements with respect to threshold crossings as accurate as possible. In the preferred embodiment, the middle timing threshold is set to zero, primarily because this region of the signal has been found to have a high correlation to slopes of both signs having high absolute values.

At step 76, if the previous signal level value is less than the middle threshold, the fact that the slope is positive indicates that the signal is approaching, but has not reached the middle threshold. As noted, a positive slope crossing of the middle threshold is one of the features used to produce sample timing intervals for computing the signal. While the details concerning the production of such sample timing intervals are developed below, it is clearly desirable to know the timing and signal level information for progressive A/D conversions approaching the middle threshold. Then, once the middle threshold has been crossed, data from the previous conversion provides a close estimate of the middle threshold crossing parameters. Thus, at step 79, the time of the previous A/D conversion and the previous value and current value of the signal level are stored in locations of program storage 26 assigned to the time and levels of the signal below the middle threshold (BelowMidThr) and below the high threshold (BelowHighThr). With this data stored, the program flows to step 86 which compares the sign of the slope at the previous conversion to the slope sign at the current conversion. If the slope has not changed, the subroutine flows to step 88, which does two things. First, in the preferred embodiment, an indication that no peak has been found is produced. Next, because some of the information analyzed has been extracted from a new current conversion produced by A/D converter 22, the time count, or number of conversions produced, is incremented. Multiplication of the time count by the conversion rate of A/D converter 22 provides a convenient timing reference for measurements of the signal. If a change in slope is detected at step 86, the previous slope was negative and has now become positive, indicating that a negative peak has been encountered. This indication is produced at step 90 where the time count is additionally incremented.

If the previous value of the signal is not less than the middle threshold, step 76 of the INTERRUPT HANDLER subroutine 68 directs the program to step 82. There, the signal level at the previous A/D conversion is compared to the high timing threshold set in step 62 of the INITIALIZATION routine 42. If the previous signal level value is less than the high threshold, the positive slope indicates that the high threshold is being approached but has not yet been exceeded. Therefore, the time of the previous A/D conversion and levels of the signal determined by the previous and current A/D conversions can replace the information previously stored about the signal below the high threshold. Storage of this information occurs at step 84 of the subroutine. As with the middle threshold approach information, by continually updating the high threshold approach information until the high threshold is crossed, a determination of the signal timing and level immediately before the high threshold crossing is available.

The routine then proceeds to step 85, where the time count is incremented and an indication produced that no peak has been found. The absence of a peak is clearly indicated in the following manner. A peak only occurs as the slope of the signal changes signs. With the slope of the signal currently positive, the occurrence of a peak would necessarily indicate a previously negative slope. Such a peak would also necessarily be negative. This possibility, however, is ruled out by the fact that step 85 is reached only when the signal has exceeded the middle, non-negative, timing threshold at step 76. Thus, any change in slope at this point in the subroutine simply indicates a positive inflection point, and a "no peak" indication can properly be produced. If the previous value of the signal is not less than the high timing threshold, step 87 produces an indication that a peak has not yet been found and increments the time count in the same manner and for the same reasons as in step 85.

The preceding discussion of the INTERRUPT HANDLER subroutine 68 is substantially mirrored when the sign of the signal slope at the previous conversion is determined by step 72 to be negative. Thus, in step 92, the value of the signal level at the current A/D conversion is compared to the negative gain threshold. If the current value is less than the negative gain threshold (greater in absolute value) the gain, timing thresholds, and previous and current values of signal level are reduced by one-half at step 94 before proceeding to step 96. Otherwise, the INTERRUPT HANDLER subroutine 68 flows directly from step 92 to step 96.

As the negative slope region of the input signal approaches the middle and low timing thresholds, the corresponding signal level is decreasing. Therefore, at step 96, the value of the signal level at the previous conversion is tested to see whether it remains above the middle threshold. If it is, timing and level information can be repeatedly extracted until information regarding the conversion immediately preceding the threshold crossing is determined. Thus, time and signal level information are stored at locations in program storage 26 identifying the conversion point above the middle threshold (AbovMidThr) and above the low timing threshold (AbovLowThr), as shown in step 98.

The subroutine next determines whether the slope of the signal has changed by comparing the slope at the previous A/D conversion to the slope at the current A/D conversion. This occurs at step 106 and if the slope has not changed, step 108 produces an indication that no peak has been found, because the negatively sloping signal, being above the middle threshold, is not yet negative and, therefore, cannot have a negative peak. Step 100 also increments the time count. If the slope has changed, step 110 indicates that a positive peak has been found and increments the time count.

If the negatively sloping signal has already crossed the middle timing threshold, its level is less than the middle threshold and the program proceeds to step 102. There, the subroutine checks to see whether the low timing threshold has been crossed. If it has not, the value of the signal at the previous conversion remains greater than the lower threshold, and timing and level information for the previous conversion are stored at the locations indicating timing and signal level approaching the low threshold crossing, as shown in step 104. The routine then proceeds to step 105, which produces an indication that no peak has been found because only a positive peak could precede a negatively shaped portion of the signal and that possibility is precluded by the negative value of the signal at this point. Step 105 additionally increments the time count.

If the level of the signal at the previous conversion is below the low timing threshold, the subroutine continues to step 107 which produces an indication that no peak has been found and increments the count of the number of conversions produced.

As noted earlier, the INTERRUPT HANDLER subroutine 68 is invoked after each conversion produced by A/D converter 22. The information produced by the subroutine concerning the occurrence of peaks, the level and timing of the signal adjacent the various timing threshold crossings, and the time count, is stored in data storage 28. Thus, the ANALYZE WAVEFORM routine 44 can obtain this information at any time by calling upon the appropriate register in data storage 28.

FIG. 4B is a flow chart for the first portion of the main ANALYZE WAVEFORM routine 44. The function of this section of the program is to detect an initially acceptable reference peak of either polarity for use in subsequent timing measurements. Step 114 of the routine checks the appropriate registers of data storage 28 after each A/D conversion to determine whether a peak has been found and the associated signal level and timing information for threshold crossings preceding the peak. Each time step 114 fails to encounter a peak indication, the ANALYZE WAVEFORM routine 44 progresses to step 116, which allows the program to be interrupted if, for example, a given number of time counts or conversions have been exceeded without recognition of a peak. If the requisite number of counts has been exceeded, step 116 produces a time-out signal, causing the program to flow to step 118. There a flag is set, indicating the present point of execution of the program, and the program exited to the DISPLAY/OUTPUT NOTE routine 50, which produces an inoperative condition display for the musician. If the number of counts required by step 116 to exit the program has not been exceeded, the program returns to step 114. Data storage 28 is then checked for the existence of a peak at the next interrupt.

When step 114 of the program finally detects a peak, the direction of program flow is dependent upon the polarity of the peak. For example, if a positive peak is first encountered, the program flows to step 120. There, the level of the input signal produced at the current A/D conversion, as determined by step 70 of the INTERRUPT HANDLER subroutine 68, is compared to a positive peak detection threshold level initialized at step 62 of the INITIALIZATION routine 42. If the current signal level indicative of the positive peak is less than the positive peak detection threshold level, the routine is returned to step 114 where new information will be derived from data storage 28 at the next interrupt.

If the peak detected at step 114 exceeds the positive peak detection threshold level, step 120 directs the program to step 122. There, other information received from the INTERRUPT HANDLER subroutine 68 is analyzed. Thus, the positive peak is considered a valid timing reference point if the information derived from data storage 28 indicates that the middle and high threshold levels were exceeded. If not, the program flow is returned to step 114 where the search for a satisfactory positive reference peak is continued. If step 122 indicates that the positive peak received from step 120 was preceded by signal crossings of the middle and high timing thresholds, however, the program flow continues to step 124, which directs the program to a second flow chart of the ANALYZE WAVEFORM routine 44 illustrated in FIG. 4C.

Figure 4C:
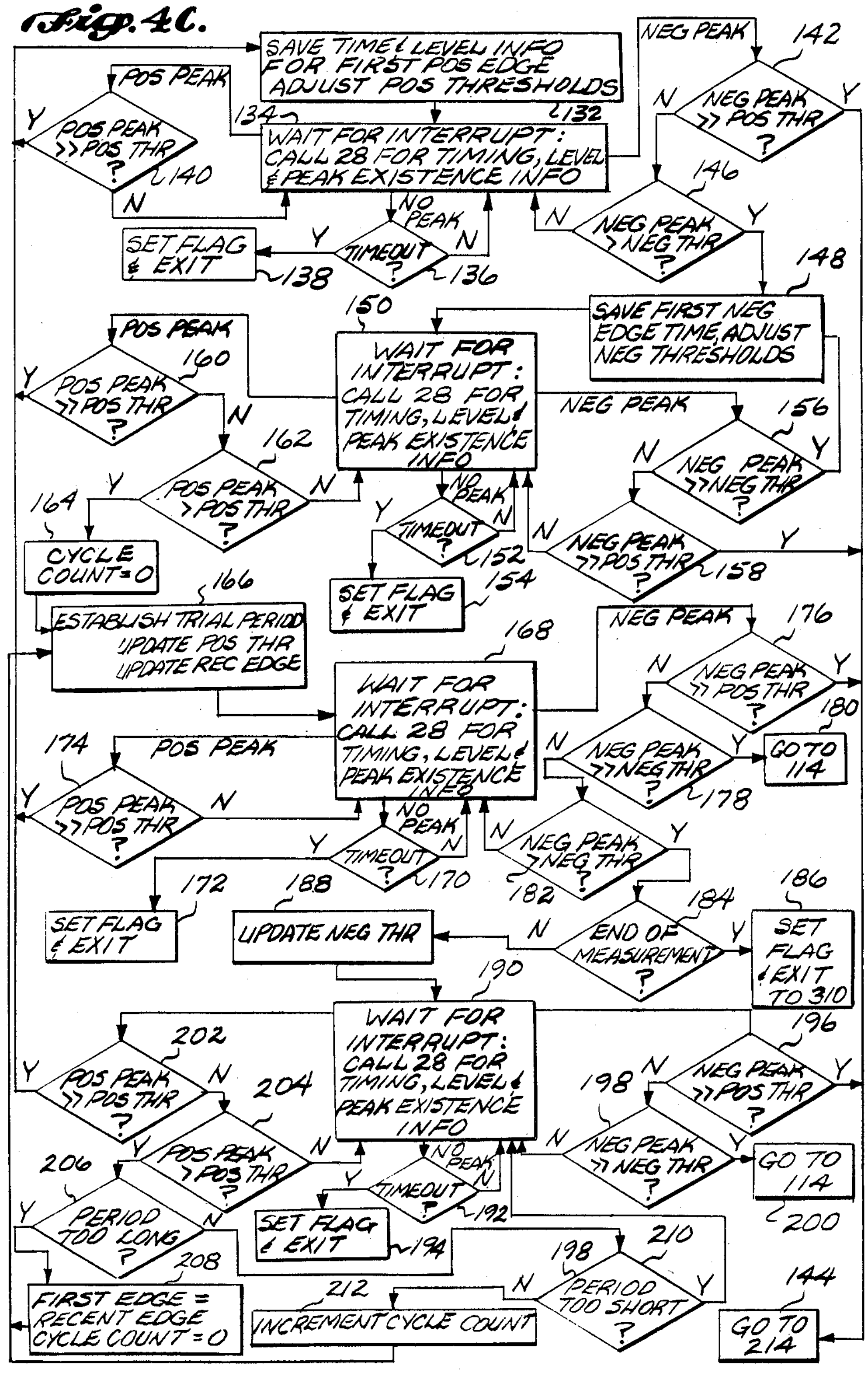
Figure 40:
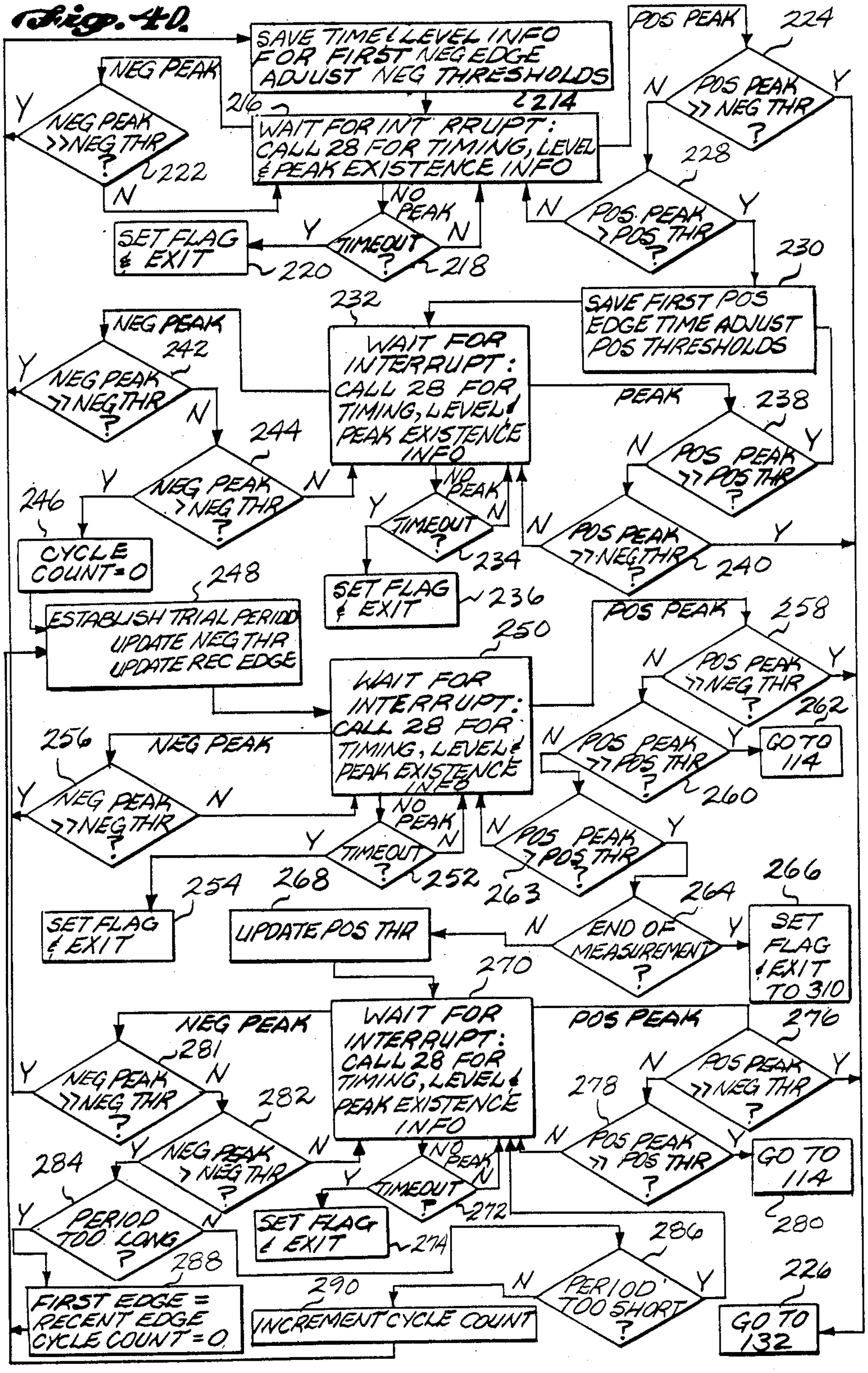

Before considering the flow chart of FIG. 4C, the flow of the program when step 114 encounters a negative peak must be considered. In this condition, the program proceeds to step 126 where the negative peak is compared to the negative threshold level established in step 62 of the INITIALIZATION routine 42. If the negative peak detection threshold has not been exceeded, the program is directed to step 114, which continues to search for an acceptable reference peak of either polarity. If the negative peak detection threshold has been exceeded, however, the program flows to step 128, which checks to see whether valid timing preceded the negative peak. Thus, if the appropriate registers of data storage 28 indicate that the middle and low timing thresholds were crossed by the edge of the signal leading to the negative peak, the program flows to step 130. Otherwise, the routine flows to step 114, which continues to search for an acceptable reference peak. Step 130 directs the program to a third flow chart of the ANALYZE WAVEFORM routine 44, illustrated in FIG. 4D and discussed below.

In summary, the portion of the ANALYZE WAVEFORM routine 44 shown in FIG. 4B continuously analyzes the information received by data storage 28 from the INTERRUPT HANDLER subroutine 68, producing an output only when a peak of either polarity is detected, exceeding the associated peak detection threshold level and preceded in time by the crossing of both associated timing thresholds. If this acceptable reference peak is positive, step 124 of the program directs the routine to step 132 and the portion of the routine illustrated in FIG. 4C. If, on the other hand, the acceptable reference peak is negative, step 130 of the routine directs the program to step 214 and the routine illustrated in FIG. 4D.

FIG. 4C illustrates a second portion of the ANALYZE WAVEFORM routine 44. This section of the program basically ensures that the positive peak selected as the initial reference peak satisfies several criteria. First, recurrences of the positive peak must be separated by a peak of opposite polarity. This minimizes the likelihood of misinterpreting the adjacent positive peaks produced by higher order harmonics to be recurrences of the reference peak. Second, this section of the program substitutes a new peak for the reference peak if one better capable of producing an accurate timing interval is located. Finally, this section of the program tests the interval between reoccurring positive peaks; eliminating from consideration those peaks that reoccur too soon and reinitiating the search for a proper reference peak when subsequent intervals are more than a predetermined amount longer than the preceding ones. These features will now be described in greater detail in conjunction with the flow chart of FIG. 4C.

As shown, step 132 of the routine stores the threshold crossing information associated with the positive reference peak as a first set of information to be used in determining sample timing intervals from which the period of the input signal will be derived. In addition, the positive peak detection threshold is adjusted to correspond to a predetermined percentage, in the preferred embodiment 75 percent, of the current conversion signal level established in step 70 of the INTERRUPT HANDLER subroutine 68. Next, the program flows to step 134, which continually searches subsequent information provided to data storage 28 by the INTERRUPT HANDLER subroutine 68, waiting for a peak of negative polarity. Each time the INTERRUPT HANDLER subroutine 68 indicates that a peak has not been found, step 134 directs the program to step 136. Step 136 tests the time count against a time-out condition and either returns the program to step 134 or sets a flag and exits the program at step 138 in the same manner as described with respect to steps 116 and 118 of the routine.

Because an acceptable reference peak has been defined as one followed by a peak of opposite polarity, the portion of the program that determines the sample timing intervals is only reached when step 134 detects a negative peak following the previously detected positive peak. Thus, if the appropriate data storage 28 register indicates another positive peak is present, the program flows to step 140. There, as long as the most recent positive peak detected at step 134 does not exceed the positive peak detection threshold by more than a predetermined amount, in the preferred embodiment 50 percent, the program returns to step 134, where data storage 28 is again searched for a peak at the next update. If, however, step 140 indicates that the most recent positive peak exceeds the positive detection threshold by the predetermined amount, the program is returned to step 132. There, this newest positive peak will become the first reference peak used. In this manner, peaks of significantly larger amplitude, capable of producing more accurate timing intervals, are substituted for less suitable peaks.

When step 134 finally receives an indication from data storage 28 that the INTERRUPT HANDLER subroutine 68 has found a negative peak, the ANALYZE WAVEFORM routine 44 is directed to step 142. There, the negative peak is also tested to determine whether its absolute value exceeds the positive threshold by more than a predetermined amount, for example, 50 percent. If so, this is determined to be a more suitable reference peak for use in the timing analysis and this section of the program is exited via step 144. Otherwise, the program is directed to step 146 where the peak level derived from data storage 28 is compared to the negative peak detection threshold. If the peak detection threshold has not been exceeded, the program returns to step 134, which continues to search the updated information in data storage 28 until a negative peak of sufficient magnitude is encountered. When such a peak is finally input to step 146, the program is directed to step 148 where signal level and timing information associated with the timing threshold crossings preceding the negative peak are stored. This information, in conjunction with that stored by step 132, provides four initial timing reference points from which four sample timing intervals will be determined by later steps. As can be seen, the timing points stored by step 132 are the middle and high timing threshold crossings of the leading edge of the cycle, while the information stored by step 148 relates to the trailing edge crossings of the middle and low timing thresholds. Before advancing the program to step 150, step 148 additionally reestablishes the negative peak detection thresholds to equal a predetermined percentage, for example, 75 percent, of the current signal level value produced by the INTERRUPT HANDLER subroutine 68 at the time the negative peak was found.

The primary function of step 150 is to wait for a recurrence of the positive reference peak that directed the positive reference peak that directed the program to step 132. As with step 134, step 150 searches data storage 28 at each interrupt for the desired positive peak. When no peak is indicated after a given number of time counts have been reached, step 152 may direct the program to step 154 where a flag is set and the program exited as previously described. Otherwise, step 152 returns the program to step 150, which continues searching until a peak is found.

If a negative peak is found at step 150, step 156 compares it to the negative peak detection threshold recently adjusted at step 148. If the signal value associated with the negative peak located exceeds that negative threshold by a predetermined amount, for example, 50 percent, the program is redirected to step 148. This indicates that the preceding negative peak was not an optimal one and the negative thresholds are readjusted. In addition, the initial negative edge timing points corresponding to the end of the cycle and used in measuring the sample timing intervals, are reestablished based upon the information most recently obtained from the INTERRUPT HANDLER subroutine 68. The search for a positive peak at step 150 is then reinitiated. If, however, the negative peak determined at step 150 had not exceeded the negative peak detection threshold by the predetermined amount, the program would have advanced to step 158. There, the value of the signal level associated with the negative peak is compared to the positive threshold and, if it exceeds that threshold by more than a predetermined amount, for example, 50 percent, the program is directed to step 144, which directs the program to another segment using this negative peak as a more suitable reference peak. As long as the negative peak found exceeds neither of the peak detection threshold levels, step 158 directs the program back to 150, which continues searching for the first recurrence of the positive reference peak initially identified.

When step 150 finally receives a positive peak indication from data storage 28, the program advances to step 160. Again, the signal level value for the positive peak derived from data storage 28 is compared to the positive peak detection threshold and if it exceeds that threshold by a predetermined amount, for example, 50 percent, this newest peak is determined to be a more suitable positive reference peak. At that point, the program is returned to step 132 where new timing information for the beginning of the sample timing intervals can be determined in conjunction with the new positive reference peak.

If the positive peak introduced to step 160 does not exceed the positive peak detection threshold by the predetermined amount, it is input to step 162. There, the positive peak received by step 150 is again compared to the positive peak detection threshold. If that threshold is not exceeded, the routine is returned to step 150, which continues to search data storage 28 for the occurrence of a positive peak of sufficient amplitude. If step 162 indicates that the positive peak detection threshold has been exceeded, however, the positive reference peak initially input to step 132 has apparently recurred. At this time, the program flows to step 164 where a period cycle count is initialized at zero. The program then flows to step 166 where three operations are performed. First, a pair of trial periods are established, each representing the time interval between the occurrences of the positive reference peak input to steps 132 and 150. This can be conveniently accomplished by use of the positive edge timing information derived from the middle and high timing threshold crossings preceding each recurrence of the reference peak. Thus, a first trial period is based upon the interval between the two middle timing threshold crossings and a second period is based upon the interval between the two high timing threshold crossings. Step 166 also adjusts the positive peak detection threshold to correspond to a predetermined percentage, 75 percent, for example, of the current signal level derived from data storage 28 at the time the most recent positive peak was located. This continual updating of the various peak detection thresholds ensures that peaks of insufficient amplitude are not mistakenly interpreted to be the same recurrent peak.

With one detection cycle complete, the program proceeds to step 168. The function of this step of the program is essentially to wait for the next negative peak of the input signal. Step 168 checks data storage 28 at each interrupt for the existence of a peak. When no peak is found, the program is directed to step 170, which either directs the program to step 172, setting a flag and exiting the program if the time count has exceeded a predetermined level, or returns the program to step 168.

If a positive peak is encountered before the desired negative peak, step 168 directs the program to step 174. There, the signal level value associated with the positive peak derived from the most recent INTERRUPT HANDLER subroutine 68 is compared to the positive peak detection threshold level. If that level is exceeded by more than a predetermined amount, for example, 50 percent, the new positive peak is determined to be a more suitable reference peak for the calculation of timing intervals. Therefore, step 174 directs the program to step 132 where the entire process is reinitiated. If the positive peak detection threshold has not been exceeded by the predetermined amount, however, the program returns to step 168, which continues to search for the desired negative peak.

When step 168 finally receives a negative peak indication from data storage 28, the program is directed to step 176. There the signal level value obtained from storage 28 for the peak is compared to the positive peak detection threshold level and if it exceeds that level by a predetermined amount, for example, 50 percent, the program is directed to step 144. In this case, the magnitude of the negative peak suggests that it would be a more suitable reference peak for use in producing timing information. Therefore, step 144 directs the program to a segment of the routine that will use this negative peak as the reference peak.

If the negative peak obtained at step 168 does not exceed the positive peak detection threshold level by a given percentage, the program is directed to step 178. There, the signal level associated with the peak is compared to the negative peak detection threshold and if that level is exceeded by more than a predetermined amount, for example, 50 percent, the routine is directed to step 180. At step 180, the routine is directed to step 114, effectively restarting the ANALYZE WAVEFORM routine 44. The restart is performed because this new, relatively large, negative peak indicates that the analysis of the preceding steps would produce an erroneous period determination if submitted to the EXTRACT PERIOD routine 46.

If the negative peak located at step 168 has not exceeded the negative peak detection threshold level by the requisite predetermined amount, step 178 directs the program to step 182. There, the signal level value associated with the negative peak is again compared to the negative peak detection threshold level. If the threshold level is not exceeded, the program is returned to step 168, which continues to search data storage 28 for the occurrence of a negative peak exceeding the threshold. When a negative peak exceeding the negative peak detection threshold level is finally received at step 182, the program is directed to step 184.

At step 184, and end-of-measurement test is performed that essentially determines whether the time count placed in data storage 28 by the INTERRUPT HANDLER subroutine 68 has exceeded a maximum measurement time established in step 62 of the INITIALIZATION routine 42. This test is included to prevent the period determination made by pitch detector 10 from taking so long that the detector output no longer appears spontaneous to the musician. If the maximum measurement time has been exceeded, the program is directed to step 186 where a flag is set indicating the program position. The program is then exited to the beginning of the EXTRACT PERIOD routine 46. If the maximum measurement time initialized has not been exceeded, step 184 directs the program to step 188. There, the negative peak detection threshold level is adjusted to correspond to a predetermined percentage, for example, 75 percent, of the signal level obtained from data storage 28 in association with the negative peak.

From step 188, the program flows to step 190 where another recurrence of the positive reference peak is awaited, indicating the conclusion of another cycle of the input signal. When step 190 calls information from data storage 28 if a peak is not detected, the program is directed to step 192. There, the program flows to step 194 if the time count currently located in data storage 28 has exceeded a predetermined level. In that case, the program flows to step 194 where a flag is set and the program exited as previously described. If the time count has not exceeded the predetermined level, however, the routine is redirected to step 190, which continues to search each update data storage 28 for the occurrence of a positive peak.

If a negative peak is encountered at step 190, the program flows to step 196 where the signal level associated with the negative peak is compared to the positive peak detection threshold level. If the positive threshold level has been exceeded by more than a predetermined amount, for example, 50 percent, the program is directed to step 144. This indicates that the negative peak located at step 190 is a more suitable reference peak for use in producing timing samples. Therefore, step 144 of the routine directs the program to another segment of the routine where this negative peak is used to determine the timing samples.

If the negative peak located at step 190 does not exceed the positive peak detection threshold level by the predetermined amount, step 196 directs the program to step 198. There, the negative peak is compared to the negative peak detection threshold level. If it exceeds that threshold level by more than a predetermined amount, for example, 50 percent, the program is directed to step 200, where the ANALYZE WAVEFORM routine 44 is restarted by sending the program to step 114, as was done in step 180. Otherwise, the program is returned to step 190, which continues to search each update of data storage 28 for an indication of a positive peak.

With a positive peak located at step 190, the program is directed to step 202. As in earlier steps, the signal level associated with the positive peak derived from the INTERRUPT HANDLER subroutine 68 is compared to the positive peak detection threshold level. If that level is exceeded by more than a predetermined amount, for example, 50 percent, the positive peak encountered at step 190 is determined to be a more suitable reference peak for timing measurements and the program is redirected to step 132. If the positive peak has not exceeded the positive peak detection threshold level by the predetermined amount, the program advances to step 204 where another comparison with the positive peak detection threshold level is made. Here, if that level has not been exceeded, the program is redirected to step 190 where the search for a positive peak greater than the threshold level is continued. If the positive peak is greater than the peak detection threshold level, the program is directed to step 206. There, the edge timing information produced at step 190 is compared to that produced at step 150 and the intervals between the two crossings of the middle timing threshold and the two crossings of the high timing threshold determined, establishing two test periods. If both of the test periods exceed the corresponding trial periods established in step 166 by a predetermined amount, for example, 12.5 percent in the preferred embodiment, the program is directed to step 208. In this case, an irregularity of period between the current cycle and the preceding cycle of the positive peak is indicated. Therefore, the sample timing information derived in part from the threshold crossing information stored by step 132 cannot be used. Step 208 thus reestablishes the first edge timing threshold crossing information used in sample timing interval calculations at the recent edge timing information values stored at step 166. The sample timing intervals will then be calculated from information beginning with this cycle of the signal and the cycle count is reset to zero in step 208.

If the trial periods were not exceeded by the test periods established between the most recent occurrences of the positive peak, the routine flows to step 210 where a determination is made whether both test periods are more than a predetermined amount less than the corresponding trial periods, for example, 12.5 percent. If they are, the positive peak selected as a reference peak may not have yet recurred. In this case, the program is returned to step 190, which continues to search each update of data storage 28 for the appearance of the reference peak.

If either test period is within a proper range of the corresponding trial period, for example, 12.5 percent, the program is directed to step 212. There, the cycle count is incremented, the positive peak detection threshold adjusted, the trial periods reestablished, and the timing threshold crossing information for the recent edge updated. The loop between steps 166 and 212 is then repeated until step 184 produces an end-of-measurement indication. At that time, timing threshold crossing information for the first edge and most recent edge of the signal is available, as is the cycle count indicating the number of cycles spanned by the timing information. This information is made available to the EXTRACT PERIOD routine 46 at step 186.

As noted earlier in conjunction with the discussion of FIG. 4B, if the ANALYZE WAVEFORM routine 44 initially encounters a negative peak, that peak will be used as the first estimate of the reference peak. As shown in step 130, the program is directed to step 214 of FIG. 4D. The flow chart illustrated in FIG. 4D is substantially a mirror of that illustrated in FIG. 4C. Now, however, the routine searches for positive peaks separating the negative reference peak. Because of the symmetry of operation, the flow chart illustrated in FIG. 4D is discussed in briefest detail, with a more detailed discussion of the reason for each step included in the discussion of the flow chart illustrated in FIG. 4C.

Step 214 initially stores the timing threshold information derived from the signal crossings preceding the negative peak located at step 114. Additionally, the negative peak detection threshold level is adjusted to correspond to a predetermined percentage, for example, 75 percent, of the signal level associated with the peak identified by the INTERRUPT HANDLER subroutine 68. The program then proceeds to step 216 where a positive peak separating recurrences of the negative reference peak is awaited. Each time data storage 28 is called and no peak is found, the program exits to a time-out step 218, where it may either be routed back to step 216 for continued searching or sent to step 220 for program exit in a manner described previously. If a negative peak is encountered before the desired positive peak, step 216 directs the program to step 222. There, the routine is returned to step 214 if the peak detected greatly exceeds, in absolute value, the negative peak detection threshold level established at step 62 of the INITIALIZE routine 42. Otherwise, the routine is returned to step 216 to continue searching for a positive peak.

When a positive peak is detected, step 224 is invoked, comparing the level of the positive peak to the negative detection threshold level. If the threshold level is greatly exceeded, the routine is directed to step 226, which, in turn, routes the program to step 132 where the positive peak will become the reference peak. If the negative peak detection threshold level has not been exceeded by the predetermined amount, the program flows to step 228, where the positive peak is compared to the positive peak detection threshold level. If that threshold level has not been exceeded, the routine returns to step 216, which continues to search for a positive peak greater than the threshold level. When a peak exceeding the threshold has been received, an acceptable intervening positive peak is indicated and the program directed to step 230. There, information concerning the crossing of the middle and high timing thresholds prior to the positive peak is stored and the positive peak detection threshold level adjusted to correspond to a predetermined percentage, for example, 75 percent, of the positive peak located at step 216.

Next, the program awaits a recurrence of the negative reference peak at step 232. Again, the failure to detect a peak of either polarity sends the routine to step 234 where it can either return or exit via step 236 as similarly discussed above. If a positive peak is encountered, steps 238 and 240 check to see whether the peak exceeds either the positive or negative peak detection threshold levels by a predetermined amount, 50 percent, for example. If the positive threshold level is exceeded by the requisite amount, the program returns to step 230, indicating a better positive peak has been found and updating the edge timing information and positive peak detection threshold. If not, step 240 is reached. There, if the negative threshold has been exceeded by the required amount, the positive peak is more suitable for use as a reference peak and the program goes to step 132 via step 226. Otherwise, the program is returned to step 232 to continue searching for the negative peak.

When step 232 encounters a negative peak, the program proceeds to step 242 where the peak is compared to the negative peak detection threshold level to determine whether it is a predetermined amount greater than that threshold. If it is, the proper negative reference peak was not initially selected and the program is returned to step 214. Otherwise, the program flows to step 244. There, a negative peak that is not greater than the negative peak detection threshold level causes the routine to return to step 232 where the search for an acceptable recurrence of the negative reference peak is continued. If the negative peak detection threshold level has been exceeded, however, the routine proceeds to step 246, where the cycle count is set to zero. Then, at step 248, a pair of trial periods are established for this first cycle based upon the two crossings of the middle and low timing thresholds, the negative peak detection threshold level is adjusted to correspond to a predetermined percentage of the level of the negative peak located at step 232, and the timing threshold crossing information of the signal edge preceding the negative peak is updated as recent edge information.

The ANALYZE WAVEFORM routine 44 continues at step 250, waiting for the occurrence of a positive peak. For each interrupt during which no peak is detected, the routine flows to step 252, which may either return the program to step 250 or cause the program to be exited at step 254. If a negative peak is encountered, step 256 checks to make sure the negative peak detection threshold level has not been exceeded by more than a predetermined amount. If it has, that peak is substituted for the reference peak at step 214. Otherwise, the routine is returned to step 250, which continues to search for the desired positive peak.

When a positive peak is detected at step 250, the routine progresses to step 258 where the peak is compared to the negative peak detection threshold level. If that level is exceeded by a predetermined amount, the positive peak is substituted as the reference peak at step 132 in the program by way of step 226. Otherwise, the program progresses to step 260 where the peak is compared to the positive peak detection threshold level. If the positive peak exceeds that threshold by a predetermined amount, the program progresses to step 262, which, in turn, directs the program to step 114 as earlier explained with respect to step 180. If the positive peak detection threshold level has not been exceeded by the requisite amount, the routine progresses to step 263, which determines whether the positive threshold has been exceeded by an acceptable positive peak. If the positive peak detection threshold level has been exceeded, the program progresses to step 264 for an end-of-measurement test. As explained previously, if the maximum measurement time initialized at step 62 of the INITIALIZATION routine 42 has been exceeded, the program is sent to the EXTRACT PERIOD routine 46 by way of step 266. If the measurement time has not been exceeded, the positive peak detection threshold level is updated at step 268 to correspond to a predetermined percentage of the positive determined at step 250.

At step 270, a recurrence of the negative reference peak is awaited. For each data conversion in which no peak is encountered, the program is directed to step 272, which either returns the routine to step 270 or causes the program to be excited at step 274. If a positive peak is encountered, step 276 tests whether the peak exceeds the negative peak detection threshold level by a predetermined amount. If it does, step 226 causes the positive peak to be used as a new reference peak at step 132. Otherwise, the routine proceeds to step 278 where the peak is tested to determine whether it exceeds the positive peak detection threshold level by a predetermined amount. If it does, step 280 causes the program to go to step 114 as earlier described in reference to step 180. Otherwise, the program returns to step 270 and continues to search for the desired negative peak.

When a negative peak is encountered by step 270, the program proceeds to step 281, which tests to see whether the peak exceeds the negative peak detection threshold level by a predetermined amount. If it does, that peak will become the new reference peak at step 214. Otherwise, the routine progresses to step 282, which tests the peak to see whether it exceeds the negative peak detection threshold level. If it does not, the program returns to step 270, which continues to search for an acceptable negative peak.

If the negative peak exceeds the negative peak detection threshold level, steps 284 and 286 determine whether both test periods established betweenn the middle and low timing threshold crossings preceding the negative peak detected at step 232 and the peak detected at step 270 fall outside a predetermined range, 12.5 percent, for example, of the corresponding trial periods. If the test periods are both too long, the information stored at step 248 concerning the recent edge is established as the first edge information previously set in step 214 and the cycle count is reset to zero at sep 288. If each test period is too short, the routine returns to step 270, which continues to search for an acceptable negative peak. If the test periods fall within the acceptable range, the cycle count is incremented at step 290 and the trial periods, negative peak detection threshold level, and recent edge timing threshold crossing information updated at step 248. The repetition of the program between steps 248 and 290 continues until the end-of-measurement test at step 264 indicates that the initialized maximum measurement time has been exceeded and step 266 directs the program to the EXTRACT PERIOD routine 46.

The EXTRACT PERIOD routine 46 will now be explained in greater detail in reference to FIGS. 5A, 5B, 6A, and 6B. The determinaton of the period is primarily accomplished by the portion of the program flow chart illustrated in FIG. 6A. Because the analog input signal produced by pickup 14 has been converted to a digital signal by A/D converter 22, the accuracy of the level and timing information corresponding to the timing threshold crossings is initially a function of the sampling rate of the A/D converter 22 and the number of amplitude increments used to represent the signal. Thus, while time and level information may be available about the signal immediately before the timing threshold crossing and immediately after the crossing, the ability to precisely identify the crossing of the timing threshold suffers somewhat. To minimize the resultant inaccuracy, the EXTRACT PERIOD routine 46 includes an INTERPOLATION subroutine 292 illustrated in FIG. 5A.

Figure 5A:
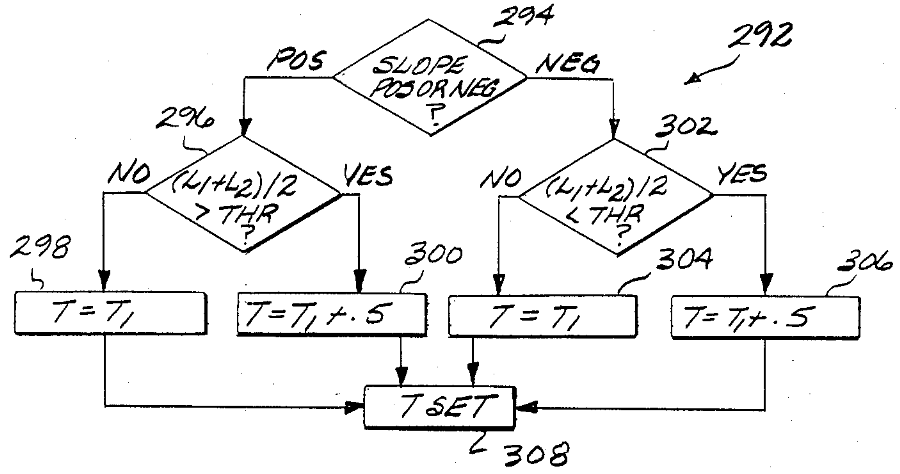
FIGS. 5A and 5B are, respectively, a flow chart of the program steps undertaken by the microprocessor in the INTERPOLATION subroutine of the EXTRACT PERIOD routine and a segment of the input signal analyzed thereby.
Figure 5B:
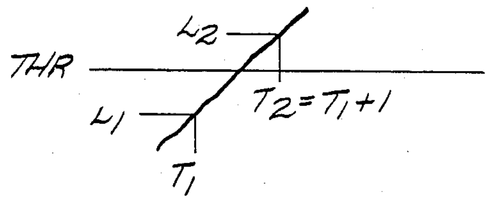

The INTERPOLATION subroutine 292 will be considered with reference to FIG. 5B, illustrating a segment of a signal having a positive slope. Signal level and timing information for the data conversions immediately preceding and following the signal crossing of the timing threshold are shown as $L_1$, $T_1$, $L_2$, and $T_2$, respectively. Step 294 of the subroutine is called upon by the EXTRACT PERIOD routine 46 to process information received from steps 166, 186, 248, and 266 of the ANALYZE WAVEFORM routine 44. As shown, step 294 tests the sign of the slope obtained from the most recent sequence of the INTERRUPT HANDLER subroutine 68. If the slope is positive, the subroutine progresses to step 296 where an average of the level values $L_1$ and $L_2$ is compared to the timing threshold level. If that level is not exceeded by the average, the estimated time, T, of crossing the timing threshold is set at $T_1$ in step 298. If the average of the two levels exceeds the timing threshold level, the routine is directed to step 300 where the estimated time is established as $T_1$ plus one-half the time of a digital sample interval. If $L_1$ and $T_1$ and $L_2$ and $T_2$ represented respective points on a negatively sloping line immediately before and after the crossing of the timing threshold, a mirrored flow is developed at step 302. There, an average of the two levels is compared to the level of the timing threshold and, if the average is not less than the timing threshold, T is set at $T_1$ in step 304. If the average is less than the timing level, step 306 of the routine sets the estimated crossing time at $T_1$ plus one-half the time occurring between digital samples. The output of the INTERPO- LATION subroutine 292 is the estimated threshold crossing time, T, and is available at step 308.

Figure 6B:
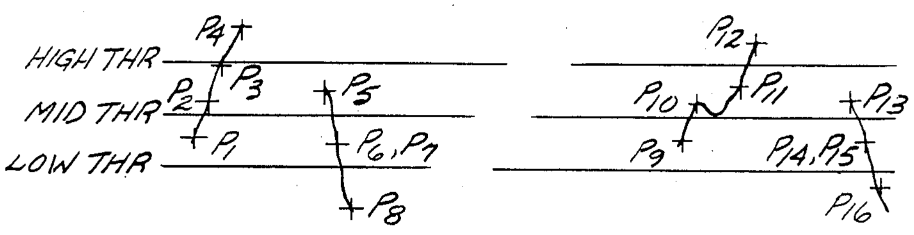
FIGS. 6A and 6B are, respectively, a flow chart illustrating the program steps undertaken by the microprocessor during the majority of the EXTRACT PERIOD routine and segments of an exemplary waveform analyzed thereby.
Figure 6A:
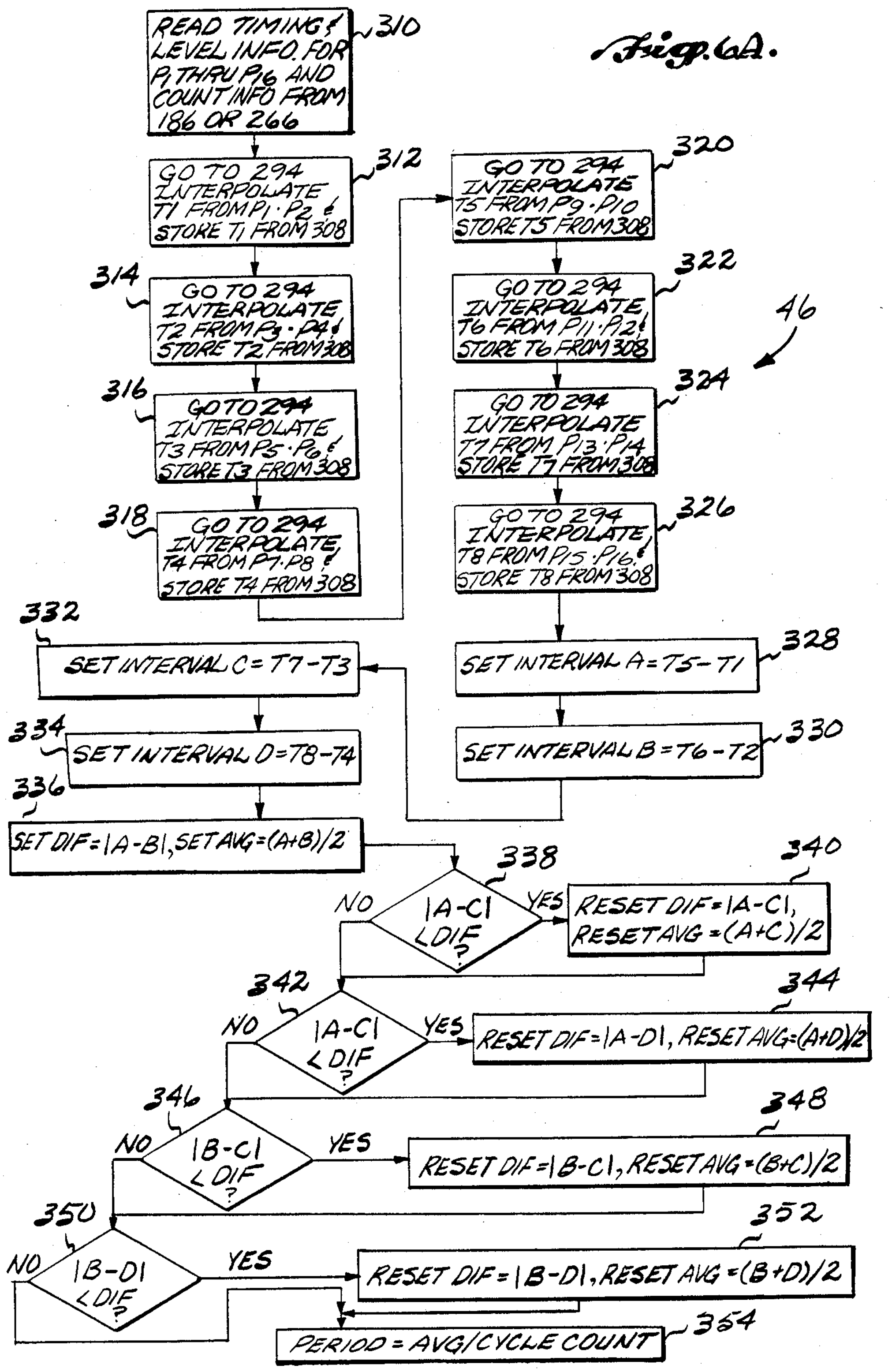
Figure 7:
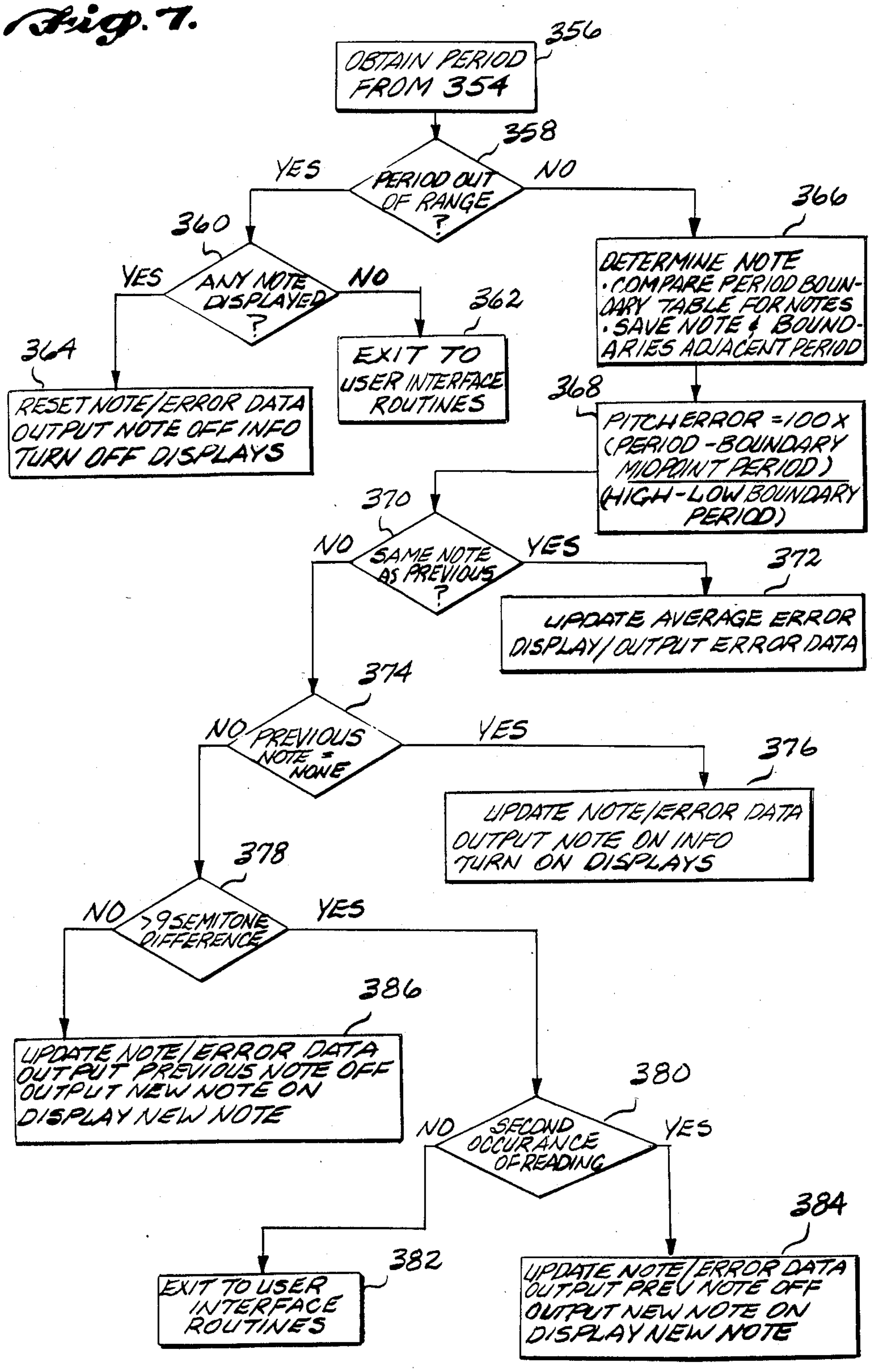
FIG. 7 is a flow chart illustrating the program steps undertaken by the microprocessor of the pitch detector in the DETERMINE NOTE routine.

The major portion of the EXTRACT PERIOD routine 46 is illustrated in the flow chart of FIG. 6A. The description of FIG. 6A proceeds with reference to segments of a signal illustrated in FIG. 6B. The times $P_1$ through $P_{16}$ correspond to data regarding first edges and recent edges of the signal received from steps 186 and 266 of the ANALYZE WAVEFORM routine 44. This information, along with the cycle count identifying the number of cycles between the edges of $P_1$ and $P_9$, for example, is input at step 310 of the routine. At step 312 the timing and level information for $P_1$ and $P_2$ is sent to step 294 of the INTERPOLATION subroutine 292, which interpolates a threshold crossing time, T1 at step 308 that is stored by step 312 of the EXTRACT PERIOD routine 46. At step 314 a value for T2 is similarly interpolated from $P_3$ and $P_4$. T3 is interpolated from $P_5$ and $P_6$ at step 316. At step 318, T4 is interpolated from $P_7$ and $P_8$. T5 is interpolated from $P_9$ and $P_{10}$ at step 320. $P_{11}$ and $P_{12}$ are interpolated to yield T6 at step 322. T7 is produced from $P_{13}$ and $P_{14}$ at step 324, and, finally, T8 is interpolated from $P_{15}$ and $P_{16}$ at step 326.

The next section of the EXTRACT PERIOD routine 46 produces four sample timing interval values from the interpolated threshold crossing times computed above. Thus, at step 328, a first interval A is set to equal T5-T1. Similarly, in step 330, a second sample timing interval B is set to equal T6-T2. In step 332, the third sample timing interval C is set to equal the time between T7 and T3. Finally, the fourth sample timing interval D is set to equal T8-T4.

The remainder of the routine shown in FIG. 6A is used, in part, to determine which of the sample timing intervals established above are most nearly the same in duration. Thus, intervals that may have been affected by distortion in the signal, as shown in FIG. 6B at $P_{10}$, can be eliminated. With the best sample timing interval selected, their averge can then be taken and divided by the cycle count to provide a more accurate indication of the period of the input signal.

In step 336, the difference (DIF) in sample timing interval duration is first determined for intervals A and B by setting the difference equal to the absolute value of A-B. Then, an initial value for the average sample timing interval (AVG) to be used in calculating the period is set at one-half the sum of A and B. At this time the program progresses to step 338, where the absolute value of A–C is compared to the value established for DIF in step 336. If sample timing intervals A and B were more nearly the same than sample timing intervals A and C, the program continues to step 342. If sample timing intervals A and C are closer than intervals A and B, however, the value of DIF is reset to equal the absolute value of the difference between intervals A and C and the average sample timing interval is reset to equal one-half the sum of A and C, at step 340. At step 342, the absolute value of the difference between sample timing intervals A and D is compared to the previous value of DIF. Unless these sample timing intervals are closer in length than the two previously used to establish DIF, the program continues to step 346. If A and D are closer in length, however, the program proceeds to step 344, before reaching step 346, and the values of DIF and the average sample timing interval length are reset on the basis of sample timing intervals A and D. At step 346, the difference in lengths of sample timing intervals B and C is compared to the value previously established for DIF and unless they are more nearly the same length, the program progresses to step 350. Otherwise, the program is directed to step 350 via step 348 where DIF and the average sample timing interval to be used are reset on the basis of sampling timing intervals B and C. The final comparison of sample timing interval duration comes at step 350, where the difference in length of intervals B and D is compared to the previously established value for DIF. If B and D are the two sample timing intervals most nearly the same, the program progresses to step 352 where the value for DIF and the average sample timing interval is reset on that basis. If sample timing intervals B and D were not the closest in length, or if they were and step 352 has been completed, the program progresses to step 354. There, the average sample timing interval received is based on the two sample timing intervals that are most nearly the same. The period of the input signal is then computed on the basis of this final average sample timing interval, divided by the cycle count input at step 310 of the routine. This averaged period determination further enhances the accuracy of peak detector 10 by minimizing the effect of local signal distortion. It should be noted that the above method of analysis excludes the average of sample timing intervals C and D from the set of possible final average sample timing intervals because it is assumed that at least one of the timing intervals measured with respect to the leading edge of the signal will be acceptable.

The next routine of the MAIN program 40 to be considered is the DETERMINE NOTE routine 48. The period determination obtained at step 354 of the EXTRACT PERIOD routine 46 is input to the DETERMINE NOTE route 48 at step 356. The routine compares the period at step 358 to the minimum and maximum acceptable period levels established at step 62 of the INITIALIZATION routine 42. This step effectively tests to see whether the pitch of the note produced by sound source 12 is within the expected range of periods to be analyzed by pitch detector 10. If the period is out of range, the program proceeds to step 360 where the note display 30 is checked to see whether a note was previously displayed. If the display was previously clear, the program proceeds to step 362. There, the program is directed to the USER INTERFACE routine 52 where an indication that the note is outside the acceptable pitch range is produced. If a note was previously displayed, the routine proceeds to step 364, which does a number of things. First, note and error data saved in data storage 28 are reset to eliminate the information corresponding to the note currently displayed. Second, a signal that the note is off is output to the digital interface 36. Finally, the note and pitch error displays 30 and 32 are turned off.

If the test at step 358 reveals that the period was not out of range, the routine progresses to step 366. There, the routine uses a successive approximation approach, comparing the period received at step 356 to a table of period boundaries associated with the various musical notes within the acceptable range. The note is identified by determining which two note boundaries the period lies between. The note and adjacent period boundaries are then stored.

At step 368, the pitch error is determined. The distance between the period boundaries established in step 366 is 100 cents. The midpoint between the two boundary periods is the period of the note displayed. Therefore, the difference between the measured period and the midpoint period divided by the difference between the upper and lower boundary periods is equal to the pitch error in cents when multiplied by 100. In this manner, the error in pitch between the note produced by sound source 12 and that displayed by note display 30 is determined at step 368.

The program next proceeds to step 370 where a comparison is made between the note determined at step 366 and that previously displayed. If the two notes are the same, the routine progresses to step 372. There, an average pitch error is determined by comparing the pitch error determined at step 368 with pitch errors produced in previous progressions through the DETERMINE NOTE routine 48. Step 372 additionally directs the program to cause pitch error display 32 to display the updated pitch error data produced.

If the note determined at step 366 is not the same as the previously displayed note, step 370 directs the routine to step 374. There, the routine checks to see whether any note was previously displayed. If none was displayed, the program progresses to step 376. At that point, the note and pitch error data are updated to correspond to that determined at step 366 and step 368. Additionally, a "note on" message is produced for digital interface 36. Finally, the note and pitch error displays 30 and 32 are turned on and the appropriate data displayed.

If a note was previously displayed, the routine advances to step 378. Here, a test is made to determine whether an unusual note change has occurred between the note determined at step 366 and the previously displayed note. For example, in the preferred embodiment, step 378 checks to determine whether a nine-semitone difference exists between the notes. It is felt that such changes are relatively unlikely to occur and, therefore, prior to displaying the new information, the determination of the note produced at step 366 should be rechecked. Thus, if that difference is exceeded, the program progresses to step 380. Step 380 returns the program to step 114 of the ANALYZE WAVEFORM routine 44 and uses the information obtained from the next note determination made by step 366 to determine whether the same note has recurred. If not, the routine advances to step 382, which causes the program to exit to the USER INTERFACE routine 52 where the operator is notified. If, on the other hand, the reading occurs a second time, data indicating the note and pitch error determined in steps 366 and 368 is updated at step 384. Step 384 additionally outputs messages to digital interface 36 that the previous note is "off" and a new note, that determined in step 366, is "on". Finally step 384 causes the DISPLAY/OUTPUT NOISE routine 50 to initiate the appropriate display.

When the nine-semitone difference has not been exceeded by the most recent note determined at step 366, the routine advances from step 378 to step 386 where the note and pitch error data are updated, messages are provided to the digital interface that the previous note is "off" and a new note is "on", and the DISPLAY/OUTPUT NOTE routine 50 is addressed, producing the appropriate display. Because the DISPLAY/OUTPUT NOTE routine 50 and USER INTERFACE routine 52 only provide the appropriate hardware responses to the programming described above, details of these routines will be clear to one skilled in this area and are, therefore, not considered in greater detail.

While the invention has been described with reference to a preferred embodiment, it is to be clearly understood by those skilled in the art that the invention is not limited thereto, and that the scope of the invention is to be interpreted only in conjunction with the following claims.

The embodiments of the invention in which an exclusive property or privilege is claimed are defined as follows:

1. An apparatus, for determining the pitch of a substantially periodic audio input signal having one or more sinusoidal components forming a series of peaks of a given polarity that are separated by at least one peak of opposite polarity and that define at least one cycle of said signal, comprising:

a first means for producing a plurality of overlapping, sample timing intervals from a portion of said input signal;

a second means for producing an indication of the period of said input signal from said plurality of sample timing intervals; and a third means for converting said indication of said period of said input signal into a determination of the pitch of said input signal.

2. The apparatus of claim 1, wherein said second means comprises:

means for determining an average sample timing interval from selected ones of said sample timing intervals; and means for dividing said average sample timing interval by the number of cycles of said portion of said input signal that said sample timing intervals were produced from, to obtain an indication of the period of said input signal.

3. The apparatus of claim 2, further comprising:

means for identifying a substantially recurrent reference peak on said input signal, said reference peak separated in occurrence by a peak of opposite polarity and having an amplitude at least a predetermined percentage of the maximum peak amplitude of said input signal, said means for producing a plurality of sample timing intervals being responsive to the occurrence of said reference peak.

4. The apparatus of claim 3, further comprising:

means for establishing a plurality of timing thresholds, at least some of said thresholds being established at an amplitude at which said input signal exhibits a relatively high slope, said means for producing said sample timing intervals initiating said intervals as the edge of said input signal leading to said reference peak crosses predetermined ones of said thresholds and as the last edge of the same said cycle of said input signal trailing to the next said occurrence of said reference peak crosses predetermined ones of said thresholds, said means for producing sample timing intervals terminating said intervals as corresponding edges of a subsequent cycle of said input signal cross corresponding ones of said thresholds.

5. The apparatus of claim 4, wherein said means for identifying said recurrent reference peak further comprises:

a fourth means for establishing an initial occurrence of said reference peak; and a fifth means for determining whether said initial occurrence of said reference peak is followed by subsequent occurrences of said reference peak having substantially the same amplitude and being separated from each other by substantially the same time intervals.

6. The apparatus of claim 5, wherein said means for identifying said recurrent reference peak further comprises:

means for establishing positive and negative peak detection thresholds and for adjusting said thresholds in response to variations of said input signal, said positive threshold adjusted when a positive peak is received that is larger than the previous said positive threshold, and said negative threshold adjusted when a negative peak is received that is larger than the previous said negative threshold.

7. The apparatus of claim 6, wherein said means for identifying said recurrent reference peak further comprises:

a sixth means for establishing an adjustable trial period for said input signal from a first portion of said signal;

a seventh means for establishing a test period for said signal from a second portion of said signal; and an eighth means for comparing said test period to said trial period, said eighth means causing said fifth means to indicate that no said subsequent occurrences of said reference peak have been encountered when said test period is a predetermined amount less than said trial period and further causing said fifth means to continue searching for said subsequent occurrences of said reference peak, said eighth means causing said fourth means to reestablish said initial occurrence of said reference peak when said test period exceeds said trial period by a predetermined amount.

8. The apparatus of claim 1, wherein said means for converting said indication of said period into an indication of said pitch further comprises:

means for comparing said input signal pitch to the pitches of the various musical notes and producing an indication of which note said input signal is closest to in pitch and the difference in pitch between said input signal and said note.

9. The apparatus of claim 8, wherein said means for comparing said input signal pitch to the pitches of various musical notes additionally requires the pitch of said input signal to be confirmed by a second iteration before producing an indication of the closest note when the initial determination of said input signal pitch differs from the preceding determination of pitch by a predetermined amount.

10. The apparatus of claim 1, wherein said first, second, and third means comprise:

program memory means for storing a set of program instructions; and a microprocessor responsive to said set of program instructions.

11. The apparatus of claim 10, further including circuitry for conditioning said audio input signal prior to said sample timing intervals being produced, comprising:

a low-pass filter, for removing the high-frequency components of said input signal;

an amplifier, for controlling the gain of said input signal received from said low-pass filter within predetermined limits;

an analog-to-digital converter, for providing a digital representation of said input signal received from said amplifier, said digital representation including positive, negative, and zero values; and a timing circuit, for initiating said analog-to-digital converter.

12. The apparatus of claim 11, wherein said means for converting said indication of said period of said input signal into an indication of the pitch of said input signal further comprises:

means for comparing said pitch of said input signal with the standard pitches associated with the musical notes;

means for displaying said musical note whose pitch is closest to said pitch of said input signal; and means for displaying the relative difference between said pitch of said musical note displayed and said pitch of said input signal.

13. The apparatus of claim 12, further comprising means for producing an audio signal having the pitch of said musical note displayed.

14. The apparatus of claim 11, further comprising means for producing a digital signal representative of said pitch of said input signal, said digital signal containing information about the musical note whose standard pitch is closest to said input signal pitch and containing information about the difference between said standard pitch and said input signal pitch.

15. The apparatus of claim 2, wherein said selected ones of said sample timing intervals are said sample timing intervals that are most nearly alike.

16. The apparatus of claim 7, wherein said timing thresholds include a zero threshold and positive and negative thresholds empirically selected to correspond to said amplitudes at which said input signal exhibits said relatively high slope.

17. The apparatus of claim 16, wherein said predetermined ones of said timing thresholds initiating said sample timing intervals are said zero and positive thresholds when said reference peak is positive and said zero and negative thresholds when said reference peak is negative, said zero and negative thresholds terminating said sample timing intervals when said reference peak is positive, and said zero and positive thresholds terminating said sample timing intervals when said reference peak is negative.

18. The apparatus of claim 6, wherein said means for identifying said recurrent, reference peak separated in occurrence by a peak of opposite polarity establishes the initially encountered peak of said input signal as an initial said reference peak, replacing said reference peak whenever a subsequent peak is encountered having an absolute value more than 50 percent greater than that of the previous said reference peak and ignoring potential reference peaks and said peaks of opposite polarity having an absolute value less than 75 percent of that of the previous corresponding peak.

19. The apparatus of claim 7, wherein said predetermined amount less than said trial period and said predetermined amount greater than said trial period are both 12.5 percent.

20. The apparatus of claim 11, wherein said first means for producing a plurality of distinct sample timing intervals further comprises:

means for identifying the signal amplitude and timing for said digital representation of said input signal immediately before and immediately after said signal crosses each of said predetermined ones of said timing thresholds; and means for producing interpolated crossing times for said digital representation of said input signal to identify when said input signal crosses said predetermined ones of said timing thresholds, said interpolated crossing times for use by said first means in initiating and terminating said sample timing intervals.

21. The apparatus of claim 20, wherein said means for producing said interpolated crossing times further comprises:

a ninth means for comparing said signal amplitude immediately before and immediately after said signal crosses each of said predetermined ones of said timing thresholds, said ninth means producing an indication of the slope of said signal;

a tenth means for producing an average signal-crossing amplitude from said signal amplitude immediately before and immediately after said signal crosses each of said predetermined ones of said timing thresholds; and an eleventh means for comparing said average signal-crossing amplitudes with the corresponding said predetermined ones of said timing thresholds crossed, said means for producing said interpolated crossing times setting said interpolated crossing time equal to said occurrence time of said digital representation of said input signal immediately before said signal crosses said corresponding timing threshold, in a first instance, when said ninth means indicates said slope is positive and said eleventh means indicates said average signal-crossing amplitude is not greater than said corresponding timing threshold and, in a second instance, when said ninth means indicates said slope is negative and said eleventh means indicates said average signal-crossing amplitude is not less than said corresponding timing threshold, said means for producing said interpolated crossing times setting said interpolated crossing times equal to the midpoint between said occurrence times of said digital representation of said signal immediately before and immediately after said signal crosses each of said predetermined ones of said timing thresholds in all other cases.

* * * * *